United States Patent [19]

Kataoka et al.

[11] 4,451,551

[45] May 29, 1984

[54] RADIATION-SENSITIVE POLY(AMIC ACID) POLYMER COMPOSITION

[75] Inventors: Fumio Kataoka; Fusaji Shoji, both of Yokohama; Isao Obara, Kamakura; Hitoshi Yokono, Katsuta; Tokio Isogai, Fujisawa; Mitumasa Kojima, Hitachi, all of Japan

[73] Assignees: Hitachi, Ltd.; Hitachi Chemical Company, both of Tokyo, Japan

[21] Appl. No.: 331,875

[22] Filed: Dec. 17, 1981

[30] Foreign Application Priority Data

Dec. 17, 1980 [JP] Japan .................................. 55-177200
Jun. 24, 1981 [JP] Japan .................................. 56-96489
Jun. 24, 1981 [JP] Japan .................................. 56-96493
Jun. 24, 1981 [JP] Japan .................................. 56-96494
Oct. 19, 1981 [JP] Japan .................................. 56-165806

[51] Int. Cl.³ ............................................. G03C 1/68
[52] U.S. Cl. ........................ 430/270; 204/159.14; 204/159.18; 430/197; 430/283; 430/919; 430/920
[58] Field of Search ............... 430/197, 270, 283, 919, 430/920; 204/159.14, 159.18

[56] References Cited

U.S. PATENT DOCUMENTS

| | | | |
|---|---|---|---|
| 3,179,614 | 4/1965 | Edwards | 528/21 |
| 3,740,305 | 6/1973 | Hoback et al. | 528/21 |
| 3,923,522 | 12/1975 | Hata et al. | 430/197 |
| 3,984,250 | 10/1976 | Halstead et al. | 430/197 |
| 4,242,437 | 12/1980 | Rohloff | 430/270 |

Primary Examiner—Jack P. Brammer
Attorney, Agent, or Firm—Antonelli, Terry & Wands

[57] ABSTRACT

A light- or radiation-sensitive polymer composition comprising (a) a poly(amic acid) having as a major component a repeating unit of the formula:

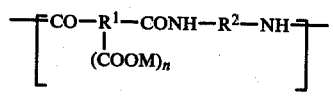

(b) one or more light- or radiation-sensitive compounds having an amino group and an aromatic azide group or aromatic sulfonylazide group in one molecule, and if necessary (c) one or more photosensitizers and/or amine compounds having at least one unsaturated bonding, and/or (d) one or more compounds having at least two unsaturated bonding in one molecule, is highly sensitive to light and radiation and can give a precise relief pattern on a substrate. Further, a finally obtained polyimide film is excellent in heat resistance.

21 Claims, No Drawings

RADIATION-SENSITIVE POLY(AMIC ACID) POLYMER COMPOSITION

BACKGROUND OF THE INVENTION

1. FIELD OF THE INVENTION

This invention relates to a novel light- or radiation-sensitive polymer composition giving a heat-resistant polymer material.

2. BRIEF DESCRIPTION OF THE PRIOR ART

There have heretofore been known, as heat resistant light- or radiation-sensitive materials, light- or radiation-sensitive polymer compositions obtained by mixing a polymer having poly(amic acid) as a main constituent, which is a precursor of a polyimide, with an amine compound containing at least one carbon-carbon double bond and at least one amino group or quaternary salt thereof which can be dimerized or polymerized by actinic light. However, such materials have sensitivity of as low as several hundreds to several thousands mJ/cm$^2$, and hence requires a long hardening time.

SUMMARY OF THE INVENTION

This invention provides a light- or radiation-sensitive composition which is free from the above-mentioned defect of the prior art, has storage stability permitting their industrial utilization, and is highly sensitive to light or radiation.

The above-mentioned object can be achieved by using as an amine compound a light- or radiation-sensitive compound having an amino group and an aromatic azide group or aromatic sulfonylazide group in one molecule.

Concretely, this invention provides a light- or radiation-sensitive polymer composition comprising (a) a poly(amic acid) having as a major component a repeating unit of the formula:

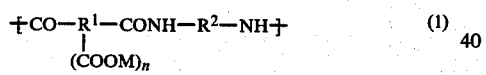

wherein $R^1$ is a trivalent or tetravalent organic group having at least 2 carbon atoms; $R^2$ is a divalent organic group having at least 2 carbon atoms; M is hydrogen or an ammonium ion; and n is an integer of 1 or 2, (b) one or more light- or radiation-sensitive compounds having an amino group and an aromatic azide group or aromatic sulfonylazide group in one molecule, and if necessary (c) one or more photosensitizers and/or amine compounds having at least one unsaturated bonding, and/or (d) one or more compounds having at least two unsaturated bondings in one molecule.

DETAILED DESCRIPTION OF THE PREFERRED EMBODIMENTS

Materials used in this invention and the like are explained below.

The component (a), i.e., the poly(amic acid) having the repeating unit of the above-mentioned formula (1) as a major component can be converted into a polyimide by heating or the action of a suitable catalyst, and the polyimide is highly heat resistant.

The poly(amic acid) having the repeating unit (1) as a major component may be either a polymer having the repeating units (1) alone or a copolymer having other repeating units together with the repeating units (1). The kinds of the other repeating units used in the copolymer are not limited but preferably selected so long as the heat resistance of the polyimide obtained by heat treatment is not greatly lowered. The heat resistance of the polymide is desired to be as good as in that even if the polyimide is heated in an atmosphere of nitrogen at 250° to 450° C. for 1 hour, a relief pattern formed can be retained. The repeating units used for copolymerization are particularly desirable when they can give a heat resistant polyimide, and typical examples thereof include repeating units of poly(amic acid) and poly(ester amic acid) stated in an article of Hara et al. "Present State and Tendency of Heat Resistant High Polymer" (Sekiyu Gakkai Shi 17, 110–120, (1974)), however the repeating units are not limited thereto.

In the above-mentioned formula (1), $R^1$ is a trivalent or tetravalent group having at least two carbon atoms and is preferably an aromatic ring or a heteroaromatic ring from the viewpoint of the heat resistance of the polyimide. Concrete examples of $R^1$ include

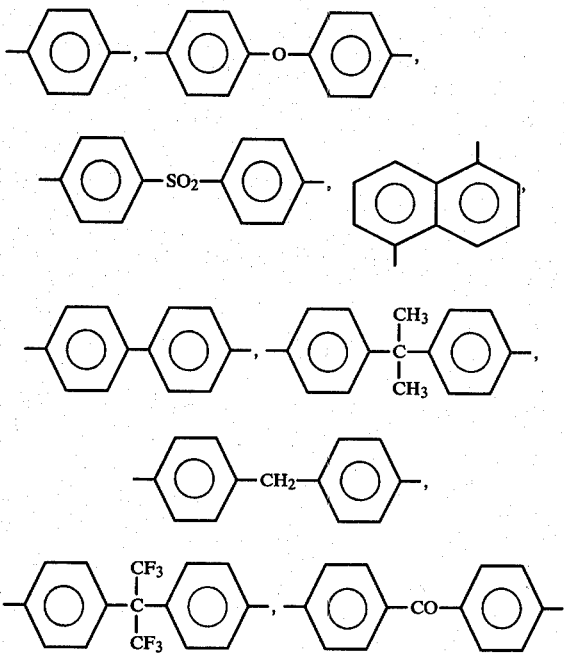

wherein the bonding lines individually represent bonding to the carbonyl group of the polymer main chain, and the carboxyl group is situated at a position ortho to the bonding line. However, $R^1$ is not limited thereto. The poly(amic acid) having the repeating unit of the formula (1) may be a copolymer in which $R^1$ comprises two or more of the above-mentioned groups. Particularly preferable ones are

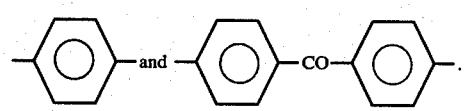

$R^2$ is a divalent organic group having at least two carbon atoms and is preferably an aromatic ring or a heteroaromatic ring from the viewpoint of the heat resistance of the polyimide obtained from the poly(amic acid).

Concrete examples of $R^2$ include

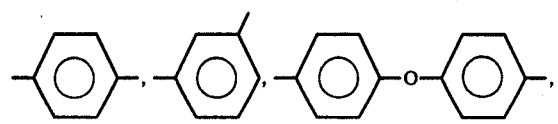
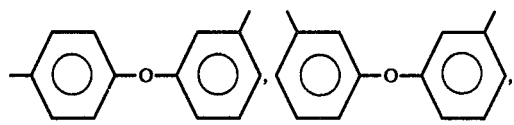
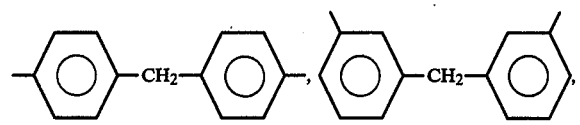
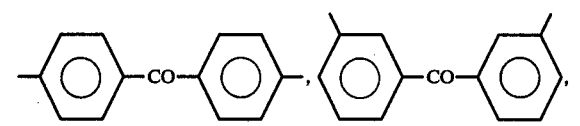
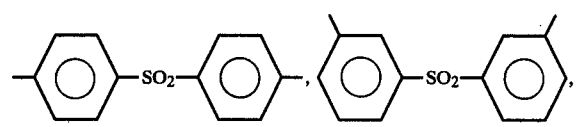
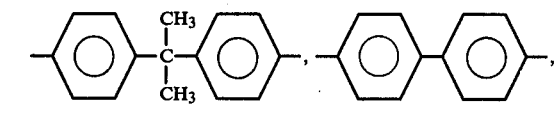
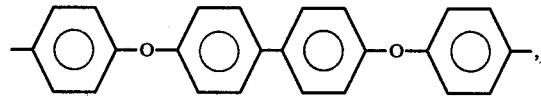
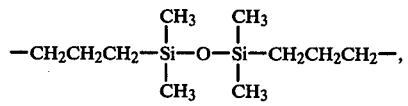

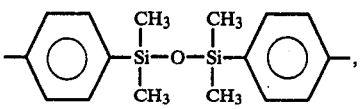
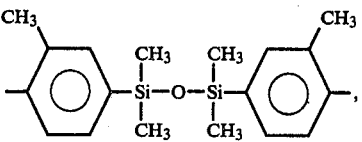
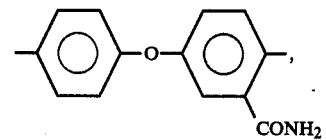
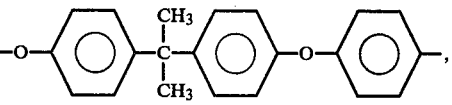
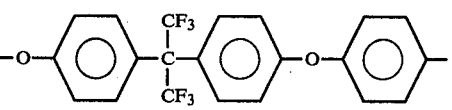

However, $R^2$ is not limited thereto. These groups may have one or more substitutents such as an amino group, an amide group, a carboxyl group, a sulfonic acid group, a sulfonamide group, or the like so long as these groups give no bad effect on the heat resistance of the polyimide.

As the poly(amic acid) having the repeating unit of the above-mentioned formula (1) as a main component, there are preferably used, for example that derived from pyromellitic acid dianhydride and 4,4'-diaminodiphenyl ether; that derived from pyromellitic acid dianhydride, 3,3',4,4'-benzophenonetetracarboxylic acid dianhydride and 4,4'-diaminodiphenyl ether; that derived from pyromellitic acid dianhydride, 3,3',4,4'-benzophenonetetracarboxylic acid dianhydride, 4,4'-diaminodiphenyl ether and 4,4'-diaminodiphenylether-3-carbonamide; that derived from pyromellitic acid dianhydride, 3,3',4,4'-benzophenonetetracarboxylic acid dianhydride, 4,4'-diaminodiphenyl ether, 4,4'-diaminodiphenylether-3-carbonamide and bis(3-aminopropyl)tetramethyldisiloxane; that derived from pyromellitic acid dianhydride, 3,3',4,4'-benzophenonetetracarboxylic acid dianhydride, 4,4'-diaminodiphenylether and bis(3-aminopropyl)tetramethyldisiloxane, and the like.

More preferable examples of the poly(amic acid) having the repeating unit of the above-mentioned formula (1) are as follows:

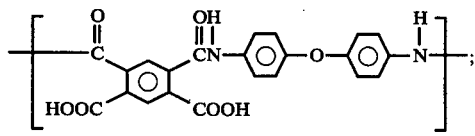

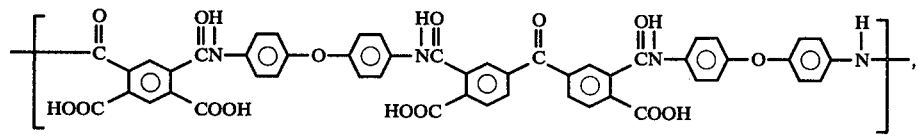

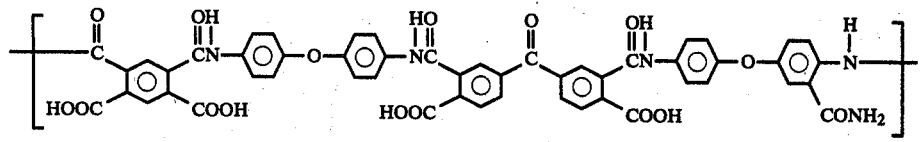

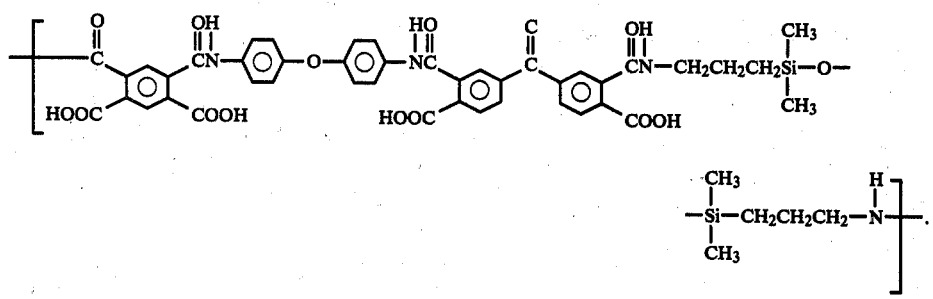

The poly(amic acid) having the repeating unit of the above-mentioned formula (1) can usually be obtained by reacting a diamine compound with an almost equimolar amount of an acid dianhydride, as described, for example, in U.S. Pat. Nos. 3,179,614, 3,740,305, etc. As a reaction solvent in this case, there are preferably used polar solvents from the viewpoint of the solubility of a poly(amic acid) to be produced, and aprotic polar solvents are particularly suitable.

Typical examples of the aprotic polar solvents include N-methyl-2-pyrrolidone, N,N-dimethylformamide, N,N-dimethylacetamide, dimethylsulfoxide, hexamethylphosphoric triamide, N-acetyl-ε-caprolactam, 1,3-dimethyl-2-imidazolidinone, and the like.

The light- or radiation-sensitivity of the composition of this invention is attributable to the light- or radiation-sensitivity of the component (b), i.e., the compound having an amino group and an aromatic azide group or aromatic sulfonylazide group in one molecule. The aforesaid compound or compounds can be incorporated into the repeating unit of the formula (1) by ionic combination of the amino group of the component (b) with the carboxyl group in the repeating unit of the formula (1). The aromatic azide group and aromatic sulfonylazide group are relatively excellent in thermal stability, and give an active species nitrene owing to light such as ultraviolet rays, and radiation such as, electron beam, X-rays, etc., and the active species causes dimerization, addition to a double bond, hydrogen abstraction reaction, and the like. Therefore, the light- or radiation-sensitive compound of above (b) incorporated into the repeating unit of the formula (1) brings about a cross-linkage to the poly(amic acid) having the repeating unit of the formula (1) as a major component through the above-mentioned reactions owing to irradiation with light or radiation, resulting in difference in solubility between the irradiated portions and unirradiated portions, whereby the formation of a pattern becomes possible.

As to the light-sensitivity, the preferable compounds are those having sensitivity of 100 mJ/cm$^2$ or less (as measured at 365 nm by using a 500 W Xe-Hg lamp) at an exposure dose of ultraviolet light giving a value of 0.5 in terms of the post-development film thickness nomalized by the thickness of the coating film.

The light- or radiation-sensitive compounds having an amino group and an aromatic azide group or aromatic sulfonylazide group in one molecule include the compounds represented by the general formulas (2) to (7). These may be used alone or in combination of two or more of them.

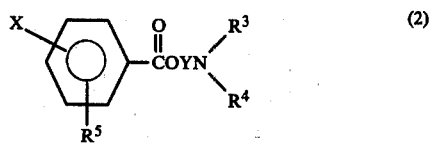

wherein X is —N$_3$ or —SO$_2$N$_3$; Y is an alkylene group having preferably 5 or less carbon atoms; and R$^3$, R$^4$ and R$^5$ are independently hydrogen or a lower alkyl group.

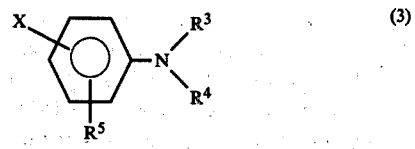

wherein X is —N$_3$ or —SO$_2$N$_3$; and R$^3$, R$^4$ and R$^5$ are independently hydrogen or a lower alkyl group.

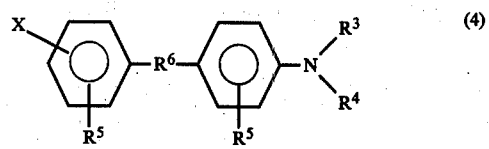

wherein X is —N$_3$ or —SO$_2$N$_3$; R$^3$, R$^4$ and R$^5$ are independently hydrogen or a lower alkyl group; and R$^6$ is a group selected from the group consisting of

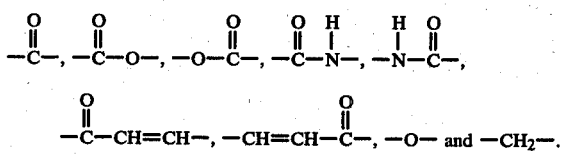

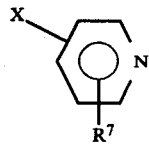

(5)

wherein X is —N₃ or —SO₂N₃; and R⁷ is hydrogen or a lower alkyl group.

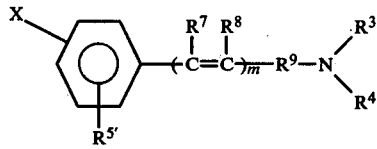

(6)

wherein X is N₃ or SO₂N₃; R⁵' is a univalent group or an atom selected from the group consisting of a nitro group, halogens, hydrogen, lower alkyl groups, lower alkoxy groups and a cyano group; R⁷ is hydrogen or a lower alkyl group; R⁸ is a univalent group or an atom selected from the group consisting of hydrogen, a cyano group, lower alkyl groups and halogens; R⁹ is a divalent organic group linking the unsaturated bond to the amino group, for example,

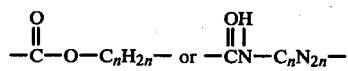

(n≦5); R³ and R⁴ are independently hydrogen or a lower alkyl group; and m is an integer of 1 to 3.

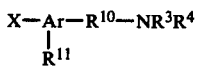

(7)

wherein Ar is an aromatic group selected from an aromatic ring and heteroaromatic ring; X is N₃— or N₃SO₂—; R¹¹ is a univalent group or an atom selected from the group consisting of hydrogen, lower alkyl groups, lower alkoxy groups, a nitro group, a carboxyl group, a sulfonic acid group and halogen; R¹⁰ is a divalent organic group linking Ar to N; and R³ and R⁴ are independently hydrogen or a lower alkyl group having 5 or less carbon atoms. Ar is, for example,

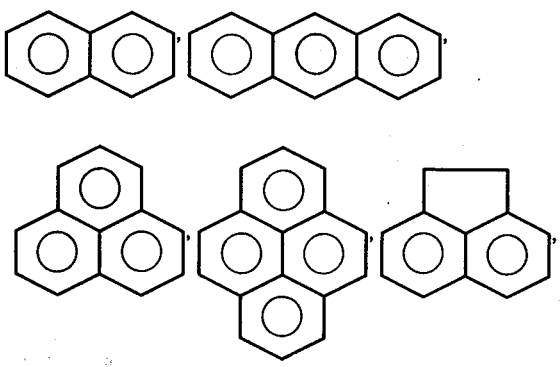

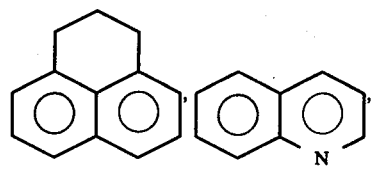

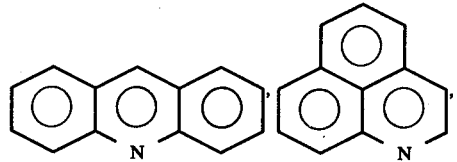

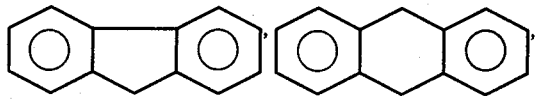

R¹⁰ includes, for example alkylens,

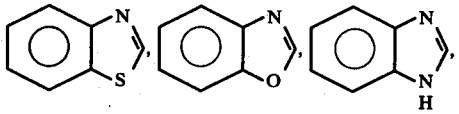

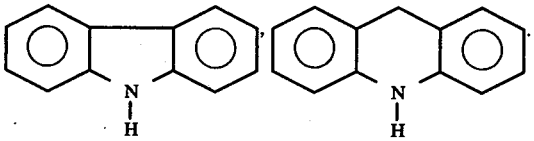

wherein R¹² is an alkylene or a divalent hydrocarbon group having a carbon-carbon unsaturated bonding.

In the above-mentioned formulas (2) to (7), the term "lower" in the alkyl groups and the like means that the number of carbon atoms is preferably 5 or less.

Among the compounds of the above-mentioned general formulas (2) to (7), the compounds of the general formula (2), (6) or (7) are preferred, and the compounds of the above-mentioned general formula (6) or (7) are particularly preferred because an inexpensive photomask made of soda glass or emulsion coating can be utilized by shifting the wavelength region for photosensitivity to a region of wavelengths longer than 300 nm by conjugating the aromatic ring with the carbon-carbon double bond in the case of the compounds of the above-mentioned general formula (6), and by converting the aromatic ring into a conjugated polycyclic ring in the case of the compounds of the above-mentioned general formula (7).

Concrete examples of these compounds include

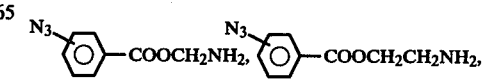

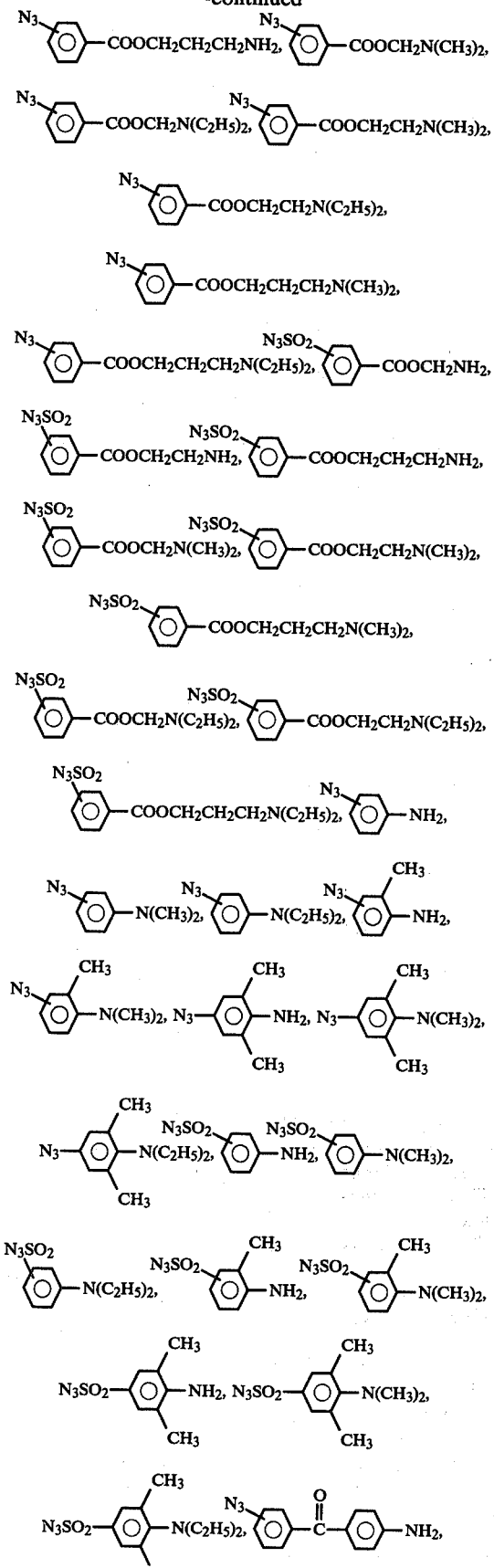
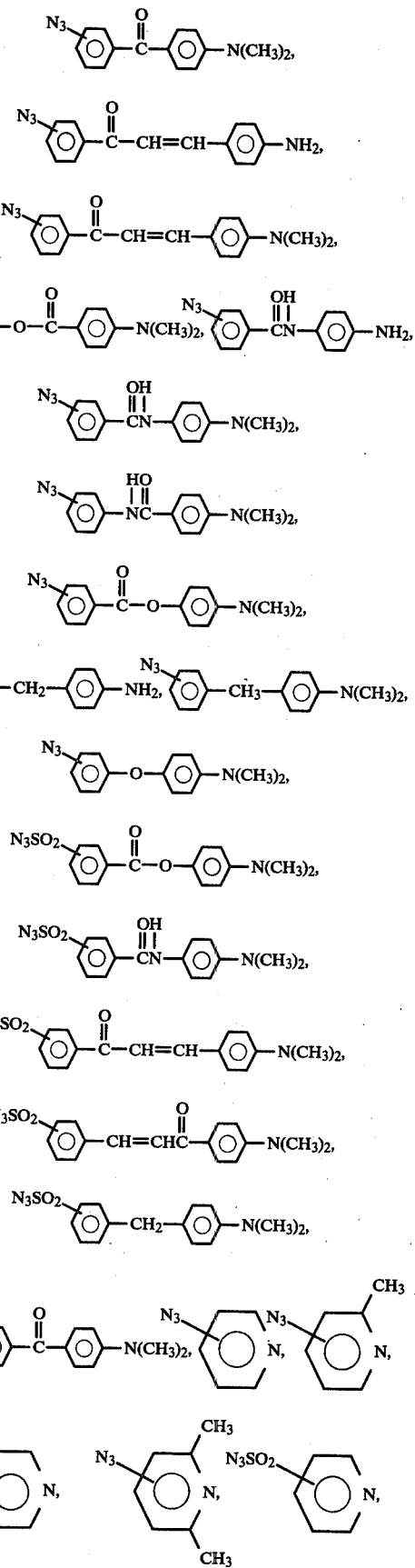

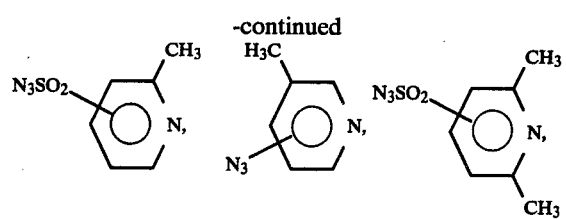

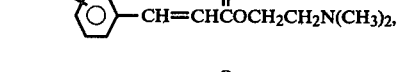

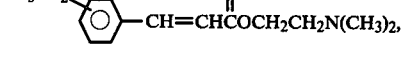

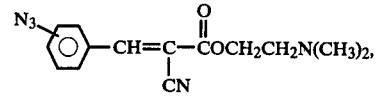

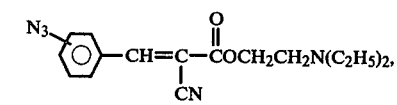

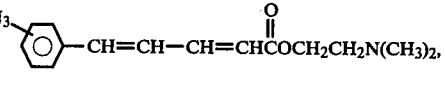

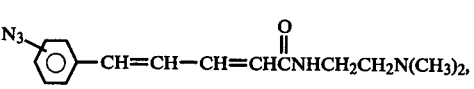

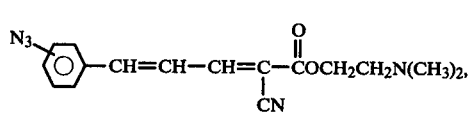

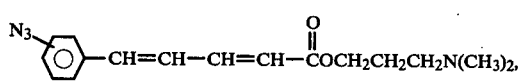

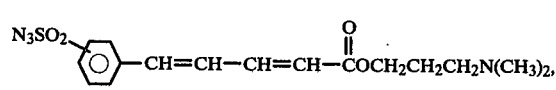

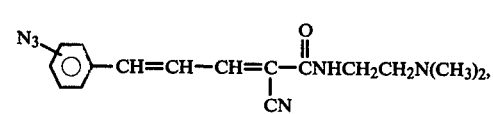

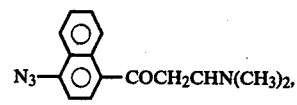

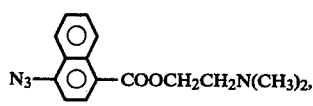

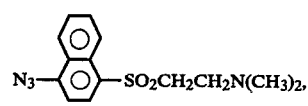

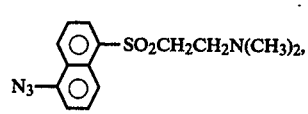

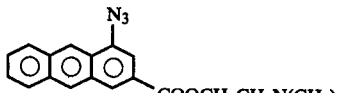

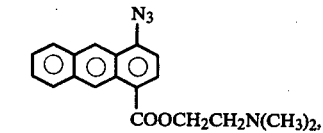

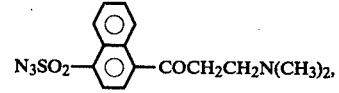

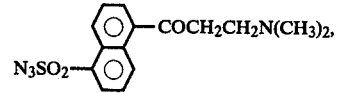

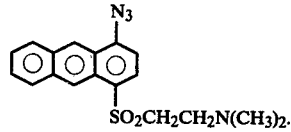

Among the compounds of the formula (2), the compounds other than those in which $R^3$ and $R^4$ are independently $C_2H_5$ are novel compounds.

The compounds of the formula (6) are novel compounds.

The compounds of the general formula (2) or (6) are synthesized, for example, by the following process. That is to say, a carboxylic acid having an aromatic azide group is reacted with thionyl chloride to synthesize an acid chloride compound having an aromatic azide group, which is then reacted with a dialkylamino alcohol or a dialkylaminoamine to form an ester linkage or an amide bonding, whereby a hydrochloride of the corresponding dialkylamine is synthesized. Subsequently, this compound is reacted with an aqueous solution of an alkali such as NaOH, KOH or the like, whereby the compound (2) or (6) can be obtained.

The light- or radiation-sensitive compound of the component (b) is preferably incorporated in an amount of 0.05 to 5 times, desirably 0.05 to 3 times, more desirably 0.4 to 3 times, most desirably 0.4 to 2 times the equivalent of the total COOM groups of the repeating units of the formula (1). When the incorporated amount is outside the above-mentioned widest range, the light- or radiation-sensitivity is lowered, or the developability have many restrictions. When the incorporated percentage is particularly high, there is brought about a bad effect on the heat resistance of the produced polyimide after the final heat treatment.

The light- or radiation-sensitive composition of this invention is usually used in the form of a varnish prepared by dissolving the poly(amic acid) (a) having the repeating unit of the formula (1) as a major component and the compound or compounds of the aforesaid component (b) in a suitable organic solvent. The solvent used in this case is desired to be able to dissolve both the poly(amic acid) having the repeating unit of the formula (1) and the compound of the aforesaid (b). For this reason, there are mainly and preferably used polar solvents, more preferably aprotic polar solvents. The polar solvents include, for example, N-methyl-2-pyrrolidone, N-acetyl-2-pyrrolidone, N,N-dimethylformamide, N,N-dimethylacetamide, dimethylsulfoxide, hexamethylphosphorictriamide, N-acetyl-ε-caprolactam, dimethylimidazolidinone, etc. These may be used alone or as a mixture thereof.

The solvent is preferably used in an amount of 100 parts by weight or more and 10,000 parts by weight or less, more preferably 200 parts by weight or more and 5,000 parts by weight or less based on 100 parts by weight of the total of the component (a), the poly(amid acid) having the repeating unit of the formula (1), the light- or radiation-sensitive compound of the component (b), and the components (c) and (d) which are used if necessary and explained below. When the amount of the solvent is too large or too small, the film-forming property is undesirably influenced.

The light- or radiation-sensitive polymer composition of this invention may further contain, if necessary, one or more unsaturated amines, photosensitizers, crosslinking auxiliaries, adhesion improving agents in addition to the component (a), the poly(amic acid) having the repeating unit of the formula (1) as a major component, and the compound of the component (b).

The photosensitizers (the component (c)) improve the light- or radiation-sensitivity by enlarging the wavelength region for photosensitivity of the photosensitive group or by efficiently giving light energy to the photosensitive group. The unsaturated amines are incorporated as a reaction partner of the photosensitive groups of the constituents other than light-sensitive compounds. Therefore, when both a photosensitizer and an unsaturated amine are used, they may be used alone or in combination.

As the photosensitizers, there may be used, for example, anthraquinone, 2-methylanthraquinone, 2-ethylanthraquinone, benzoquinone, 1,2-naphthoquinone, 1,4-naphthoquinone, 1,2-benzoanthraquinone, benzophenone, p,p'-dimethylbenzophenone, Michler's ketone, 2-nitrofluorein, 5-nitroacetonaphthene, 4-nitro-1-naphthylamine, anthrone, 1,9-benzanthrone, dibenzalacetone, benzoin ether, 4,4'-bis(diethylamino)benzophenone, acridine, cyanoacridine, nitropyrene, 1,8-dinitropyrene, pyrene-1,6-quinone, 9-fluorenone, anthanthrone, 2-chloro-1,2-benzanthraquinone, 2-bromobenzanthraquinone, 2-chloro-1,8-phthaloylnaphthalene, and the like.

The amount of the photosensitizer which is added if necessary is preferably 0.01% by weight or more and 10% by weight or less, more preferably 1% by weight or more and 10% by weight or less based on the total weight of the components (a), (b) and (c). If the amount is too large, there is brought about restriction to the developability or a bad effect on the heat resistance of the final product polyimide.

Typical examples of the adhesion-improving agents include organic silicon compounds such as vinyltriethoxysilane, γ-methacryloxypropyltrimethoxysilane, 3-mercaptopropyltrimethoxysilane, γ-glycidoxypropyltrimethoxysilane, γ-aminopropyltriethoxysilane, and the like, and aluminum chelate compounds such as aluminum monoethyl acetoacetate diisopropylate, aluminum tris(ethyl acetoacetate), aluminum tris(acetyl acetate), aluminum tris(malonic acid ethylate), aluminum diethylacetoacetonate monoisopropylate, aluminum diacetylacetonate monoisopropylate, aluminum monomethylacetoacetate diisopropylate, aluminum dimethylacetoacetate monoisopropylate, aluminum tris(methylacetoacetate), aluminum monopropylacetoacetate diisopropylate, aluminum dipropylacetoacetate monoisopropylate, and the like.

Examples of the amine compounds (the component (c)) are unsaturated amines, e.g.,

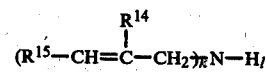

wherein $R^{14}$ is hydrogen or a methyl group; $R^{15}$ is hydrogen or a lower alkyl group or vinyl group; $k+l=3$ and $k=1$ to 3;

wherein $R^{16}$ is hydrogen or a phenyl group; $R^{17}$ is hydrogen or a lower alkyl group; $R^{18}$ is a substituted or unsubstituted hydrocarbon group; and $R^{19}$ and $R^{20}$ are independently a substituted or unsubstituted lower alkyl group;

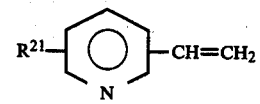

wherein $R^{21}$ is a substituted or unsubstituted lower alkyl group; and the term "lower" meaning preferably 5 carbon atoms or lower.

Concrete examples of the unsaturated amines include

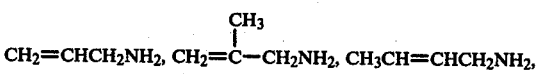

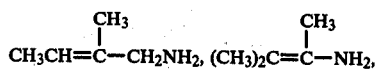

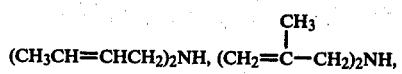

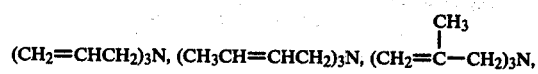

-continued

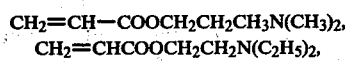
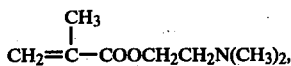
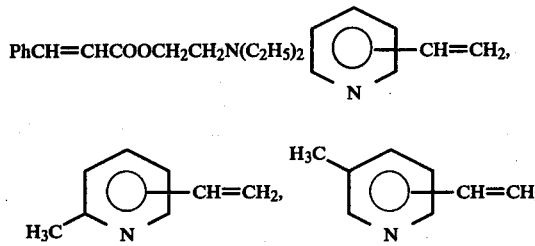

The proportion of the aforesaid amines is usually 0.05 mole or more and 2 moles or less, preferably 0.1 mole or more and 1 mole or less, more preferably 0.1 mole or more and 0.5 mole or less per mole of the light- or radiation-sensitive compounds of the aforesaid (b), and the total amounts of the light- or radiation-sensitive compounds of the aforesaid (b) and the aforesaid amine compounds (c) is 3 times or less the equivalent of the COOM group of the component (a). If the proportion is outside the range mentioned above, there is brought about restrictions to the developability or a bad effect on the heat resistance of the final product polyimide.

Further, if necessary, as the component (d), one or more compounds (except for the aforesaid unsaturated amines) having at least two unsaturated bondings in one molecule may be used as cross-linking auxiliaries.

Examples of said compounds are;

wherein $R^{22}$ is hydrogen or a methyl group; and k is an integer of 1 to 3;

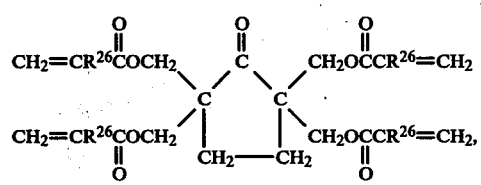

-continued

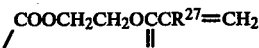

wherein $R^{23}$, $R^{24}$, $R^{26}$ and $R^{27}$ are independently hydrogen or a methyl group; $R^{25}$ is a lower alkyl group; and $l+m=4$ in which l is an integer of 2 to 4;

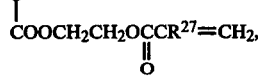

wherein $R^{28}$ is $CH_2=CH-CH_2-$; and p is an integer of 1 to 10;

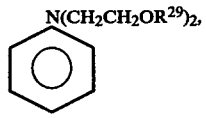

wherein $R^{29}$ is $$-\overset{O}{\underset{\|}{C}}-CH=CH_2.$$

Concrete examples of said compounds include $CH_2CH-COO(CH_2CH_2O)_2COCH=CH_2$,

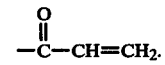

$(CH_2=CHCOOCH_2)_2C(CH_2OH)_2$, $(CH_2=CCOOCH_2)_3CC_2H_5$,

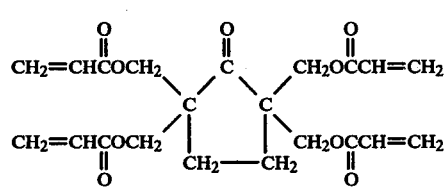

-continued

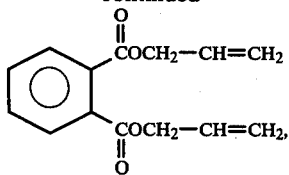

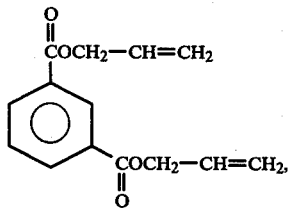

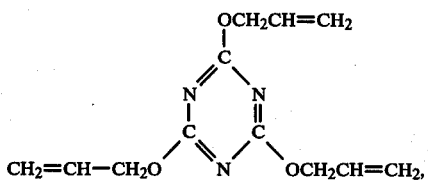

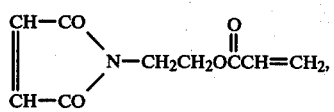

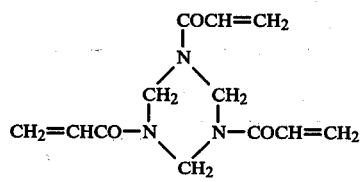

As a material for a support to which the light- or radiation-sensitive polymer composition of this invention is applied, there may be used, for example, metals, glass, semiconductive metal oxide insulators (e.g., $TiO_2$, $Ta_2O_5$, $SiO_2$, etc.), silicon nitride, and the like.

The light- or radiation-sensitive polymer composition of this invention permits pattern processing by a usual micro-processing technique using, for example, ultraviolet rays.

For coating the aforesaid support with the light- or radiation-sensitive polymer composition, there may be used processes such as a spin coating process using a spinner, an immersion, spray, printing or the like process, and these may properly be selected depending on purposes. The thickness of the coating film can be controlled by means of coating techniques, the solid content and viscosity of a varnish of the composition.

The light- or radiation-sensitive polymer composition of this invention formed into a coating film on the aforesaid support is imagewisely exposed to light, after which the unexposed portions are dissolved and removed with a developing solution, whereby a desired relief pattern can be obtained. The light source is not limited to ultraviolet rays but may be used visible rays, X-rays, electron beam, or the like.

As the developing solution, aprotic polar solvents such as N-methyl-2-pyrrolidone, N,N-dimethylformamide, N,N-dimethylacetamide, dimethylsulfoxide, hexamethylphosphorictriamide, dimethylimidazolidinone, N-benzyl-2-pyrrolidone, N-acetyl-ε-caprolactam, and the like, which are solvents of the present polymer composition, may be used alone or in the form of a mixed solution with methanol, ethanol, isopropyl alcohol, benzene, toluene, xylene, methyl Cellosolve, or the like.

The relief pattern formed by the development is then rinsed with a rinsing solution to remove the developing solvent. Suitable examples of the rinsing solution include methanol, ethanol, isopropyl alcohol, benzene, toluene, xylene, methyl Cellosolve which are good in miscibility with the developing solution.

The polymer having the relief pattern formed by the above-mentioned treatments is a precursor of a heat resistant polyimide, and is converted into a heat resistant polymer having an imide ring or other rings by heat treatment at 150° to 450° C.

The light- or radiation-sensitive polymer composition of this invention can be used for forming a passivation film for semiconductors, an interlaminar film of a multilayer integrated circuit, a soldering-protective film for a printed circuit, orientation-controlling film for liquid crystal display devices, and the like. Further, it can be used as a dry-etching resistant photoresist and a dry-etching resistant radiation sensitive resist by utilizing its high heat resistance.

This invention is explained below referring to Examples.

EXAMPLE 1

In 79 g of N-methyl-2-pyrrolidone was dissolved 100 g (0.5 mole) of 4,4'-diaminodiphenyl ether in a stream of nitrogen to prepare an amine solution. Next, 109 g (0.5 mole) of powdery pyromellitic acid dianhydride was added with stirring while maintaining the temperature of the amine solution at about 15° C. by ice-cooling. After completion of the addition, the resulting mixture was further allowed to react at about 15° C. for 3 hours to obtain a solution (A) having a viscosity of 60 poises (at 30° C.).

In 20 g of the solution (A) was dissolved 2.34 g (0.01 mole) of 2-(N,N-dimethylamino)ethyl p-azidobenzoate, after which the resulting solution was filtered under pressure through a filter of 5 μm meshes.

The thus obtained solution was applied to a silicon wafer by a spin-coating method using a spinner, and then dried at 90° C. for 30 minutes to obtain a coating film of 2.6 μm in thickness. The coating film was even and uniform and adhered to the substrate sufficiently. The coating film was closely covered with a striped mask and then irradiated with ultraviolet rays from a 500 W Xe-Hg lamp. The ultraviolet ray intensity on the exposed surface was 25 mW/cm² in a wavelength region of 365 nm. The coating film was developed with a mixed solution containing dimethylacetamide and ethanol (4:1 by volume), and then rinsed with a rinsing liquid (ethanol) to obtain a relief pattern. The change with the lapse of time in the residual film thickness was measured, and the sensitivity was calculated to be 18 mJ/cm², when there was taken as sensitivity, an exposure dose giving a value of 0.5 in terms of the residual film thickness nomalized by the applied film thickness. A relief pattern having a sharp end surface was obtained by exposure at an exposure dose of 72 mJ/cm² which was 4 times the sensitivity. The pattern was not blurred even when heated at 400° C. for 60 minutes.

EXAMPLE 2

To 20 g of the solution (A) was added 1.17 g (0.05 mole) of 2-(N,N-dimethylamino)ethyl p-azidobenzoate and 0.28 g (0.05 mole) of allylamine, and the preparation of a solution, coating, drying, exposure, development and rinsing were carried out by the same procedures as in Example 1. The sensitivity was 20 mJ/cm$^2$, and there were obtained a resolvability and heat resistance of the pattern which were both comparable to those obtained in Example 1.

EXAMPLE 3

The conditions such as the compounding proportion for samples, reaction solvent, developing solution and the like, and the results relating to coating property, sensitivity and heat resistance are shown in Nos. 1 to 33 in Tables 1 to 6. Other reaction conditions and procedures were as follows.

A diamine compound was dissolved in an aprotic polar solvent at about 15° C. in a stream of nitrogen to prepare a diamine solution. A pulverized acid dianhydride was added with stirring in a stream of nitrogen while maintaining the reaction temperature at about 15° C. After completion of the addition, the resulting mixture was further allowed to react at 15° C. for 3 hours to prepare a poly(amic acid) solution.

A light- or radiation-sensitive compound was added to the thus prepared poly(amic acid) solution. When an unsaturated amine and/or a photosensitizer were added, they were additionally dissolved in the aforesaid solution to give a uniform solution. Subsequently, the solution was filtered under pressure through a filter of 5 μm meshes to prepare a photosensitive polymer composition. In the columns for light-sensitive additives in Tables 1, 3 and 5, and in the columns for unsaturated amines in Tables 2, 4 and 6, the phrase "equivalent based on polymer COOH" means the number of equivalents of the compound added to the total carboxyl groups of the poly(amic acid). The phrase "% by weight" in the columns for photosensitizers in Table 2, 4 and 6 means a value obtained by dividing the weight of the photosensitizer by the total weights of the diamine, the acid dianhydride, the light- or radiation-sensitive compound, the unsaturated amine and the photosensitizer and multiplying the quotient by 100.

Each of the light- or radiation-sensitive polymer compositions prepared in the manner described above was applied to various substrates by a spin coating method using a spinner, and then dried at 90° C. for 30 minutes to be made into a coating film, which was then irradiated with ultraviolet rays from a 500 W Xe-Hg lamp through a striped photomask, developed, rinsed with ethanol, and then cured at 350° C. for 1 hour. The sensitivity is expressed by the term "good" when it is 100 mJ/cm$^2$ or less at an exposed dose (measured at 365 nm) giving a value of 0.5 in terms of the post-development film thickness nomalized by the applied film thickness, and by the term "bad" when it is more than 100 mJ/cm$^2$. The heat resistance is expressed by the term "good" when the weight loss is 1% or less and the formed pattern is not blurred after curing at 350° C. for 1 hour followed by heating at 300° C. for 1 hour, and by the term "bad" when the weight loss is more than 1%.

TABLE 1

| No. | Diamine compound (g, mole) | Acid dianhydride (g, mole) | Reaction solvent (g) | Light-sensitive compound (Equivalent based on polymer COOH) |
|---|---|---|---|---|
| 1 | H$_2$N—⌬—O—⌬—NH$_2$ (20, 0.1) | [pyromellitic dianhydride] (21.8, 0.1) | N—Methyl-2-pyrrolidone (258) | N$_3$—⌬—COOCH$_2$CH$_2$N(CH$_3$)$_2$ (0.04) |
| 2 | " | " | " | N$_3$—⌬—COOCH$_2$CH$_2$N(CH$_3$)$_2$ (0.1) |
| 3 | " | " | " | N$_3$—⌬—COOCH$_2$CH$_2$N(CH$_3$)$_2$ (1.0) |
| 4 | " | " | " | N$_3$—⌬—COOCH$_2$CH$_2$N(CH$_3$)$_2$ (3.0) |
| 5 | " | " | " | N$_3$—⌬—COOCH$_2$CH$_2$N(CH$_3$)$_2$ (5.0) |
| 6 | " | " | " | N$_3$—⌬—COOCH$_2$CH$_2$N(CH$_3$)$_2$ (1.0) |
| 7 | " | " | " | " |
| 8 | " | " | " | " |

TABLE 1-continued

| No. | Diamine compound (g, mole) | Acid dianhydride (g, mole) | Reaction solvent (g) | Light-sensitive compound (Equivalent based on polymer COOH) |
|---|---|---|---|---|
| 9 | " | " | " | " |
| 10 | " | " | " | " |
| 11 | " | " | " | " |

TABLE 2

| No. | Unsaturated amine (Equivalent based on polymer COOH) | Photosensitizer (% by weight) | Developing solution | Coating property (support) | Sensitivity | Heat resistance |
|---|---|---|---|---|---|---|
| 1 | — | — | Mixed solution of dimethylacetamide and ethanol (4:1 by volume) | Good (Silicon wafer) | Bad | — |
| 2 | — | — | Mixed solution of dimethylacetamide and ethanol (4:1 by volume) | Good (Silicon wafer) | Good | Good |
| 3 | — | — | Mixed solution of dimethylacetamide and ethanol (4:1 by volume) | Good (Silicon wafer) | " | " |
| 4 | — | — | Mixed solution of dimethylacetamide and ethanol (4:1 by volume) | Good (Silicon wafer) | " | " |
| 5 | — | — | Mixed solution of dimethylacetamide and ethanol (4:1 by volume) | Good (Silicon wafer) | " | Bad |
| 6 | — | Michler's ketone (5) | Mixed solution of dimethylacetamide and ethanol (4:1 by volume) | Good ($Al_2O_3$) | " | Good |
| 7 | — | 5-Nitroacenaphthene (5) | Mixed solution of dimethylacetamide and ethanol (4:1 by volume) | Good ($Si_3N_4$) | " | " |
| 8 | — | Benzophenone (10) | Mixed solution of dimethylacetamide and ethanol (4:1 by volume) | Good ($SiO_2$) | " | " |
| 9 | $CH_2=\overset{CH_3}{\underset{|}{C}}COOCH_2CH_2N(CH_3)_2$ (0.1) | — | Mixed solution of dimethylacetamide and ethanol (4:1 by volume) | Good (Al) | " | " |
| 10 | $CH_2=\overset{CH_3}{\underset{|}{C}}COOCH_2CH_2N(CH_3)_2$ (1.5) | — | Mixed solution of dimethylacetamide and ethanol (4:1 by volume) | Good (Cu) | " | " |
| 11 | $\text{C}_6\text{H}_5-CH=CH-\overset{O}{\underset{||}{C}}-O-CH_2CH_2N(CH_3)_2$ (0.5) | — | Mixed solution of dimethylacetamide and ethanol (4:1 by volume) | Good (Silicon wafer) | " | " |

TABLE 3

| No. | Diamine compound (g, mole) | Acid dianhydride (g, mole) | Reaction solvent (g) | Light-sensitive compound (Equivalent based on polymer COOH) |
|---|---|---|---|---|
| 12 | $H_2N-\text{C}_6\text{H}_4-O-\text{C}_6\text{H}_4-NH_2$ (20, 0.1) | pyromellitic dianhydride (21.8, 0.1) | Dimethylformamide (258) | $N_3-\text{C}_6\text{H}_4-COOCH_2CH_2N(CH_3)_2$ (0.5) |
| 13 | " | " | Dimethylacetamide (258) | " |
| 14 | " | " | Dimethylimidazolidinone (258) | " |
| 15 | " | " | Dimethylsulfoxide (258) | " |
| 16 | " | " | N—methyl-2-pyrrolidone (258) | $N_3SO_2-\text{C}_6\text{H}_4-COOCH_2CH_2N(CH_3)_2$ (1.0) |

TABLE 3-continued

| No. | Diamine compound (g, mole) | Acid dianhydride (g, mole) | Reaction solvent (g) | Light-sensitive compound (Equivalent based on polymer COOH) |
|---|---|---|---|---|
| 17 | " | " | N—methyl-2-pyrrolidone (258) | $N_3$-⟨O⟩-$COOCH_2CH_2CH_2N(CH_3)_2$ (1.0) |
| 18 | " | " | N—methyl-2-pyrrolidone (258) | $N_3$-⟨O⟩-$COOCH_2N(CH_3)_2$ (1.0) |
| 19 | " | " | N—methyl-2-pyrrolidone (258) | $N_3SO_2$-⟨O⟩-$COOCH_2CH_2CH_2N(C_2H_5)_2$ (1.0) |
| 20 | " | " | N—methyl-2-pyrrolidone (258) | $N_3$-⟨O⟩-$N(CH_3)_3$ (1.0) |
| 21 | " | " | N—methyl-2-pyrrolidone (258) | $N_3SO_2$-⟨O⟩-$N(CH_3)_2$ (1.0) |
| 22 | " | " | N—methyl-2-pyrrolidone (258) | $N_3$-⟨O⟩-N (pyridine) (1.0) |

TABLE 4

| No. | Unsaturated amine (Equivalent based on polymer COOH) | Photosensitizer (% by weight) | Developing solution | Coating property (Support) | Sensitivity | Heat resistance |
|---|---|---|---|---|---|---|
| 12 | $CH_2=CHCH_2NH_2$ (0.5) | — | Dimethylformamide | Good (Silicon wafer) | Good | Good |
| 13 | $(CH_2=CHCH_2)_3N$ (0.5) | — | " | Good (Silicon wafer) | " | " |
| 14 | 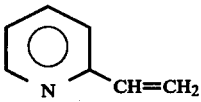 2-vinylpyridine (0.5) | — | N—methyl-2-pyrrolidone | Good (Silicon wafer) | " | " |
| 15 | $CH_2=CHCOOCH_2CH_2N(CH_3)_2$ (0.5) | — | " | Good (Silicon wafer) | " | " |
| 16 | — | — | " | Good (Silicon wafer) | " | " |
| 17 | — | — | " | Good (Silicon wafer) | " | " |
| 18 | — | — | " | Good (Silicon wafer) | " | " |
| 19 | — | — | " | Good (Silicon wafer) | " | " |
| 20 | — | — | " | Good (Silicon wafer) | " | " |
| 21 | — | — | " | Good (Silicon wafer) | " | " |
| 22 | — | — | " | Good (Silicon wafer) | " | " |

TABLE 5

| No. | Diamine compound (g, mole) | Acid dianhydride (g, mole) | Reaction solvent (g) | Light-sensitive compound (Equivalent based on polymer COOH) |
|---|---|---|---|---|
| 23 | H₂N–⟨⟩–O–⟨⟩–NH₂ (20, 0.1) | ⟨pyromellitic dianhydride⟩ (21.8, 0.1) | N-methyl-2-pyrrolidone (258) | N₃SO₂–⟨⟩–N (1.0) |
| 24 | " | " | N-methyl-2-pyrrolidone (258) | N₃SO₂–⟨⟩–COCH=CH–⟨⟩–N(CH₃)₂ (1.0) |
| 25 | " | " | N-methyl-2-pyrrolidone (258) | N₃–⟨⟩–COCH=CH–⟨⟩–N(CH₃)₂ (1.0) |
| 26 | " | " | N-methyl-2-pyrrolidone (258) | N₃–⟨⟩–CO–⟨⟩–N(CH₃)₂ (1.0) |
| 27 | " | ⟨pyromellitic dianhydride⟩ (10.9, 0.05) + ⟨BTDA-type⟩ (16.1, 0.05) | N-Methyl-2-pyrrolidone (253) | N₃–⟨⟩–COOCH₂CH₂N(CH₃)₂ (1.0) |
| 28 | " | ⟨BTDA-type⟩ (32.2, 0.1) | N-Methyl-2-pyrrolidone (243) | " |
| 29 | H₂N–⟨⟩–NH₂ (10.8, 0.1) | ⟨pyromellitic dianhydride⟩ (10.9, 0.05) + ⟨BTDA-type⟩ (16.1, 0.05) | Dimethylformamide (261) | " |

TABLE 5-continued

| No. | Diamine compound (g, mole) | Acid dianhydride (g, mole) | Reaction solvent (g) | Light-sensitive compound (Equivalent based on polymer COOH) |
|---|---|---|---|---|
| 30 | H₂N—⌬—O—⌬—NH₂ (10, 0.05)<br>H₂N—⌬(CONH₂)—O—⌬—NH₂ (12.2, 0.05) | pyromellitic dianhydride (10.9, 0.05)<br>benzophenone tetracarboxylic dianhydride (16.4, 0.05) | N-Methyl-2-pyrrolidone (251) | " |
| 31 | H₂N—⌬—O—⌬—NH₂ (16, 0.08)<br>H₂N—⌬(CONH₂)—O—⌬—NH₂ (2.4, 0.01)<br>H₂N(CH₂)₃—Si(CH₃)₂—O—Si(CH₃)₂—(CH₂)₃NH₂ (2.5, 0.01) | pyromellitic dianhydride (10.9, 0.05)<br>benzophenone tetracarboxylic dianhydride (16.1, 0.05) | N-Methyl-2-pyrrolidone (252) | " |
| 32 | H₂N—⌬—CH₂—⌬—NH₂ (19.8, 0.1) | benzophenone tetracarboxylic dianhydride (21.8, 0.1) | Dimethylformamide (258) | " |
| 33 | H₂N—⌬—⌬—NH₂ (18.4, 0.1) | benzophenone tetracarboxylic dianhydride (21.8, 0.1) | Dimethylformamide (260) | " |

TABLE 6

| No. | Unsaturated amine (Equivalent based on polymer COOH) | Photosensitizer (% by weight) | Developing solution | Coating property (Support) | Sensitivity | Heat resistance |
|---|---|---|---|---|---|---|
| 23 | — | — | N—Methyl-2-pyrrolidone | Good (Silicon wafer) | Good | Good |
| 24 | — | — | " | " | " | " |
| 25 | — | — | " | " | " | " |
| 26 | — | — | " | " | " | " |
| 27 | — | — | " | " | " | " |
| 28 | — | — | " | " | " | " |
| 29 | — | — | " | " | " | " |
| 30 | $CH_2=\overset{CH_3}{\underset{|}{C}}COOCH_2CH_2N(CH_3)_2$ (0.5) | Michler's ketone (5) | " | " | " | " |
| 31 | $CH_2=CHCH=CHCH_2NH_2$ (0.5) | Michler's ketone (1) | " | " | " | " |
| 32 | — | — | Dimethylacetamide | " | " | " |
| 33 | — | — | Dimethylacetamide | " | " | " |

EXAMPLE 4

The conditions such as the compounding proportions for samples, reaction solvent, developing solution and the like, and the results relating to coating property, sensitivity and heat resistance are shown in Nos. 34 to 38 in Tables 7 and 8. Light- and radiation-sensitive polymer compositions were prepared under the same conditions and by the same procedures as shown in Example 3, except for the above-mentioned conditions.

Each of the polymer composition prepared in the manner described above was applied to a substrate by a spin coating method and then dried at 90° C. for 30 minutes to be made into a coating film. This sample was subjected to irradiation with electron beam having an acceleration voltage of 15 kV in which the exposure was locally different, to make the irradiated portions insoluble, and then developed with a developing solvent. Next, an electron-sensitivity curve was obtained by plotting the change of post-development film thickness with the exposure dose. The sensitivity is expressed by the term "good" when the exposure dose is $6\times10^{-6}$ Coulomb/cm² or less, when there is taken, as sensitivity, an exposure giving a value of 0.5 in terms of the post-development film thickness nomalized by the applied film thickness, and by term "bad" when the exposure dose is more than $6\times10^{-6}$ Coulomb/cm². The heat resistance is expressed by the term "good" when the pattern is not blurred by heating at 350° C.

TABLE 7

| No. | Diamine compound (g, mole) | Acid dianhydride (g, mole) | Reaction solvent (g) | Radiation-sensitive additive (Equivalent based on polymer COOH) |
|---|---|---|---|---|
| 34 | H₂N—⟨○⟩—O—⟨○⟩—NH₂ (20, 0.1) | 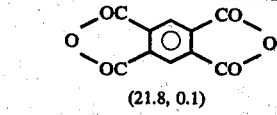 (21.8, 0.1) | N—Methyl-2-pyrrolidone (258) | N₃⟨○⟩—COOCH₂CH₂N(CH₃)₂ (1.0) |
| 35 | " | " | N—Methyl-2-pyrrolidone (258) | ⟨○⟩—COOCH₂CH₂(CH₃)₂ with N₃ (1.0) |
| 36 | " | 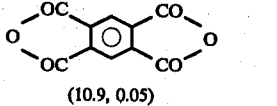 (10.9, 0.05) and (16.1, 0.05) | N—Methyl-2-pyrrolidone (253) | N₃SO₂⟨○⟩COOCH₂CH₂N(CH₃)₂ (1.0) |
| 37 | " | 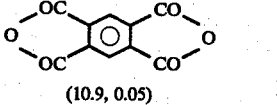 (10.9, 0.05) and (16.1, 0.05) | N—Methyl-2-pyrrolidone (253) | N₃⟨○⟩—CCH=CH⟨○⟩NH₂ (1.0) |

TABLE 7-continued

| No. | Diamine compound (g, mole) | Acid dianhydride (g, mole) | Reaction solvent (g) | Radiation-sensitive additive (Equivalent based on polymer COOH) |
|---|---|---|---|---|
| 38 | " | 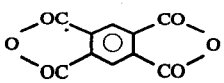 (10.9, 0.05)<br>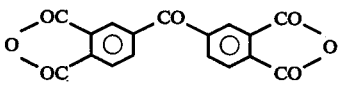 (16.1, 0.05) | N—Methyl-2-pyrrolidone (253) | 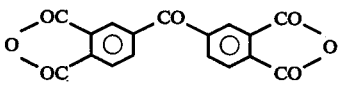 (0.5) |

TABLE 8

| No. | Unsaturated amine (Equivalent based on polymer COOH) | Photosensitizer (% by weight) | Developing solution | Coating property (Support) | Sensitivity | Heat resistance |
|---|---|---|---|---|---|---|
| 34 | — | — | N—Methyl-2-pyrrolidone | Good (silicon wafer) | Good | Good |
| 35 | — | — | N—Methyl-2-pyrrolidone | Good (silicon wafer) | " | " |
| 36 | — | — | N—Methyl-2-pyrrolidone | Good (silicon wafer) | " | " |
| 37 | — | — | N—Methyl-2-pyrrolidone | Good (silicon wafer) | " | " |
| 38 | $CH_2=CHCH_2NH_2$ | — | N—Methyl-2-pyrrolidone | Good (silicon wafer) | " | " |

There are shown below, as Comparative Examples experimental results obtained in the case of a method by which an amine compound containing at least one carbon-carbon double bond and at least one amino group or quaternary salt thereof which can be dimerized or polymerized by ultraviolet rays is added to a polymer having poly(amic acid) as a major component.

COMPARATIVE EXAMPLE 1

In 278 g of N-methylpyrrolidone was dissolved 110 g of 4,4' diaminodiphenyl ether in a stream of nitrogen to prepare an amine solution. Into 308 g of dimethylacetamide was dispersed 120 g of pyromellitic acid dianhydride to obtain a poly(amic acid) solution (B).

A solution of 50 g of the solution (B) and 1.15 g of Michler's ketone in 30 g of dimethylacetamide and a solution of 10.2 g (0.055 mole, equivalent to the total carboxyl groups of the poly(amic acid)) of diethylaminoethyl methacrylate in 10 g of dimethylacetamide were mixed until a homogeneous solution was obtained, and the resulting solution was filtered under pressure through a filter of 5 μm meshes.

The thus obtained solution was applied to a silicon wafer by a spin coating method using a spinner, and then dried at 100° C. for 5 minutes to obtain a coating film of 2 μm in thickness. The coating film was closely covered with a striped mask and then irradiated with ultraviolet rays from a 500 W Xe-Hg lamp. The ultraviolet ray intensity on the exposed surface was 25 mW/cm² in a wavelength region of 365 μm. After the exposure, the coating film was developed with a mixed solution of dimethylformamide and methanol (5:2 by volume), and then rinsed with ethanol to obtain a relief pattern. The pattern was retained even when heated at 400° C. for 60 minutes. The photosensitivity was as low as 310 mJ/cm² which was one-tenth or less of that (18 mJ/cm²) of the composition shown in Example 1.

COMPARATIVE EXAMPLE 2

A solution of 50 g of the solution (B) and 1.15 g of Michler's ketone in 30 g of dimethylacetamide and a solution of 12 g (0.055 mole, equivalent to the total carboxyl groups of the poly(amic acid)) of dimethylaminoethyl cinnamate in 10 g of dimethylacetamide were mixed until a homogeneous solution was obtained, and the resulting solution was filtered under pressure through a filter of 5 μm meshes.

The thus obtained solution was applied to a silicon wafer by a spin coating method by means of a spinner, and then dried at 100° C. for 5 minutes to obtain a coating film of 2.2 μm in thickness. The coating film was exposed, developed, and then rinsed under the same conditions as shown in Comparative Example 1 to obtain a relief pattern. The pattern was retained even when heated at 400° C. for 60 minutes, however the photosensitivity was as low as 1,500 mJ/cm² which was 1/15 of those of all the compositions examined in this invention.

EXAMPLE 5

In 1,791 g of N-methyl-2-pyrrolidone was dissolved 100 g (0.5 mole) of 4,4'-diaminodiphenyl ether in a stream of nitrogen to prepare an amine solution. Subsequently, 109 g (0.5 mole) of powdery pyromellitic acid dianhydride was added with stirring while maintaining the temperature of the solution at about 15° C. by ice-cooling. After completion of the addition, the resulting mixture was further allowed to react at about 15° C. for 3 hours to obtain a solution (C) having a viscosity of 60 poises (at 60° C.).

In 200 g of the solution (C) was dissolved 5.2 g (0.02 mole) of 2-(N,N-dimethylamino)ethyl p-azidocinnamate, after which the resulting solution was filtered under pressure through a filter of 5 μm meshes.

The thus obtained solution was applied to a silicon wafer by a spin coating method using a spinner, and then dried at 80° C. for 30 minutes to obtain a coating film of 0.5 μm in thickness. The coating film was even and uniform and adhered to the substrate sufficiently.

The coating film was closely covered with a striped mask made of soda glass and then irradiated with ultraviolet rays from a 500 W Xe-Hg lamp. The ultraviolet ray intensity on the exposed surface was 10 mW/cm² in a wavelength region of 365 nm. After the exposure, the coating film was developed with a mixed solution of N-methyl-2-pyrrolidone and ethanol (4:1 by volume), and then rinsed with a rinsing liquied (ethanol) to obtain a relief pattern. The change with the lapse of time in the residual film thickness was measured, and an irradiation characteristic curve was prepared, after which the sensitivity was calculated to be 50 mJ/cm² when there was taken, as sensitivity, an exposure dose giving a value of 0.5 in terms of the residual film thickness normalized by the applied film thickness. A relief pattern having a sharp end surface was obtained by exposure at an exposure dose of 200 mJ/cm² which was 4 times the sensitivity. The pattern was not flurred even when heated at 400° C. for 60 minutes.

EXAMPLE 6

To 100 g of the solution (C) obtained in Example 5 was added 10.4 g (0.4 mole) of 2-(N,N-dimethylamino)ethyl p-azidocinnamate, and the preparation of a solution, coating, drying, exposure, development and rinse were carried out by the same procedures in Example 1.

The sensitivity was 60 mJ/cm², and there were obtained a resolvability and heat resistance of the pattern which were both comparable to those obtained in Example 5.

EXAMPLE 7

To 200 g of the solution (C) obtained in Example 5 were added 5.2 g (0.02 mole) of 2-(N,N-dimethylamino)ethyl p-azidocinnamate and 1.1 g (0.02 mole) of allylamine, and the preparation of a solution, coating, drying, exposure, development and rinse were carried out by the same procedures as in Example 5. The sensitivity was 50 mJ/cm², and there were obtained a resolvability and heat resistance which were both comparable to those obtained in Example 5.

EXAMPLE 8

In N-methyl-2-pyrrolidone was dissolved 100 g (0.5 mole) of 4,4'-diaminodiphenyl ether in a stream of nitrogen to prepare an amine solution. Subsequently, 109 g (0.5 mole) of pyromellitic acid dianhydride was added with stirring while maintaining the solution at about 15° C. in an ice bath. After completion of the addition, the resulting mixture was further allowed to react at about 15° C. for 3 hours to obtain a solution (D) of poly(amic acid) having the repeating unit of the formula:

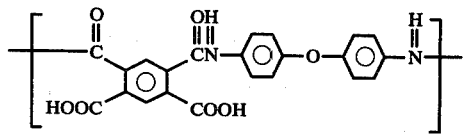

which had a viscosity of 60 poises (at 30° C.).

In 20 g of the solution (D) was dissolved 2.68 g (0.01 mole) of 2-(N,N-dimethylamino)ethyl 4-azidonaphthyl ketone, after which the resulting solution was filtered under pressure through a filter of 5 μm meshes.

The thus obtained solution was applied to a silicon wafer by a spin coating method using a spinner, and then dried at 70° C. for 30 minutes to obtain a coating film of 0.8 μm in thickness. The coating film was closely covered with a striped photomask and then irradiated with ultraviolet rays from a 500 W Xe-Hg lamp. The ultraviolet ray intensity on the exposed surface was 10 mW/cm² at a wavelength of 365 nm. After the exposure, the coating film was developed with a mixed solution containing N-methyl-2-pyrrolidone and ethanol (5:1 by volume), and then rinsed with a rinsing liquid (ethanol) to obtain a relief pattern. The change with the lapse of time in the residual film thickness was measured, and the sensitivity was 20 mJ/cm² when there was taken, as sensitivity, an exposure dose giving a value of 0.5 in terms of the residual film thickness normalized by the applied film thickness. A relief pattern having a sharp end surface was obtained by using three times as much exposure dose as the sensitivity. The pattern was not blurred even when heated at 400° C. for 60 minutes.

EXAMPLE 9

In 20 g of the solution (D) obtained in Example 8 was dissolved 0.27 g (0.001 mole) of 2-(N,N-dimethylamino)ethyl 4'-azidonaphthyl ketone, after which the resulting solution was filtered under pressure through a filter of 5 μm meshes.

The thus obtained solution was applied to a silicon wafer by a spin coating method using a spinner, and then dried at 70° C. for 30 minutes to obtain a coating film of 1.0 μm in thickness. The coating film was closely covered with a striped photomask and then irradiated with ultraviolet rays from a 500 W high pressure mercury arc lamp. The ultraviolet ray intensity on the exposed surface was 8 mW/cm² (at 365 nm). After the exposure, the coating film was developed with a mixed solution containing N,N-dimethylacetamide and ethanol (4:1 by volume), and then rinsed with a rinsing liquid (ethanol) to obtain a relief pattern. The sensitivity was 140 mJ/cm², and the relief pattern obtained was not blurred even when heated at 400° C. for 60 minutes.

EXAMPLE 10

In 20 g of the solution (D) obtained in Example 8 was dissolved 5.36 g (0.02 mole) of 2-(N,N-dimethylamino)ethyl 4'-azidonaphthyl ketone, after which the resulting solution was filtered under pressure through a filter of 5 μm meshes.

The thus obtained solution was applied to a silicon wafer by a spin coating method using a spinner, and then dried at 70° C. for 30 minutes to obtain a coating film of 3.2 μm in thickness. The coating film was closely covered with a striped photomask and then irradiated with ultraviolet rays from a 500 W high pressure mercury arc lamp. The ultraviolet ray intensity on the exposed surface was 8 mW/cm² (at 365 nm). After the exposure, the coating film was developed with a mixed solution containing dimethylformamide and ethanol (3:2 by volume), and then rinsed with a rinsing liquid to obtain a relief pattern. The sensitivity was 21 mJ/cm², and the pattern was not blurred even when heated at 400° C. for 60 minutes.

EXAMPLE 11

In 1,764 g of N-methyl-2-pyrrolidone were dissolved 90 g (0.45 mole) of 4,4'-diaminodiphenyl ether and 11.4 g (0.05 mole) of 4,4'-diaminodiphenyl ether-3-carbonamide to prepare an amine solution. Subsequently, 54.5 g (0.25 mole) of pyromellitic acid dianhydride and 80.5 g (0.25 mole) of 3,3',4,4'-benzophenonetetracarboxylic acid dianhydride were added with stirring while maintaining the amine solution at a temperature of about 15° C. in an ice bath. After completion of the addition, the resulting mixture was further allowed to react at about 15° C. for 3 hours to obtain a solution (E) of poly(amic acid) having the repeating unit of the formula:

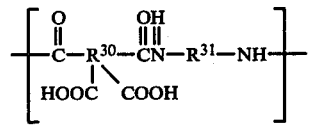

wherein $R^{30}$ consists of

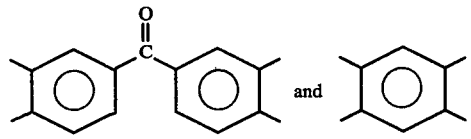

in a ratio of 1:1; and $R^{31}$ consists of

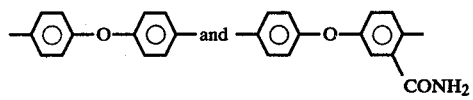

in a ratio of 9:1) which had a viscosity of 55 poises (at 30° C.).

In the solution (E) was dissolved 2.84 g (0.01 mole) of 2'-(N,N-dimethylamino)ethyl-4-azido-1-naphthalenecarboxylate, after which the resulting solution was filtered under pressure through a filter of 5 μm meshes.

The thus obtained solution was applied to a silicon wafer using a spinner and then dried at 70° C. for 30 minutes to obtain a coating film of 2.4 μm in thickness. The coating film was closely covered with a striped photomask and then irradiated with ultraviolet rays from a 500 W Xe-Hg lamp. The ultraviolet ray intensity on the exposed surface was 8 mW/cm² (at 365 nm). After the exposure, the coating film was developed with a mixed solution of N-methyl-2-pyrrolidone and ethanol (5:1 by volume), and then rinsed with a rinsing liquid (ethanol) to obtain a relief pattern. The sensitivity was 15 mJ/cm². The pattern was not blurred even when heated at 400° C. for 60 minutes.

EXAMPLE 12

In 20 g of the solution (E) obtained in Example 11 was dissolved 3.16 g (0.01 mole) of 5-azido-1-naphthyl-2'-(N,N-dimethylamino)ethylsulfone, after which the resulting solution was filtered under pressure through a filter of 5 μm meshes.

The thus obtained solution as applied to a silicon wafer by a spin coating method using a spinner, and then dried at 70° C. for 30 minutes to obtain a coating film of 2.7 μm in thickness. The coating film was closely covered with a striped photomask and then irradiated with ultraviolet rays from a 500 W high pressure mercury arc lamp. The ultraviolet ray intensity on the exposed surface was 9 mW/cm² (at 365 nm). After the exposure, the coating film was developed with a mixed solution of N-methyl-2-pyrrolidone and ethanol (5:1 by volume), and then rinsed with a rinsing liquid (ethanol) to obtain a relief pattern having a sharp end surface. The sensitivity was 25 mJ/cm², and the pattern was not blurred even when heated at 400° C. for 60 minutes.

EXAMPLE 13

In 20 g of the solution (E) obtained in Example 11 was dissolved 3.34 g (0.01 mole) of 2'-(N,N-dimethylamino)ethyl-9-azido-10-naphthalenecarboxylate, after which the resulting solution was filtered under pressure through a filter of 5 μm meshes.

The thus obtained solution was applied to a silicon wafer by a spin coating method using a spinner, and then dried at 70° C. for 30 minutes to obtain a coating film of 2.2 μm in thickness. The coating film was closely covered with a striped photomask and then irradiated with ultraviolet rays from a 500 W high pressure mercury arc lamp. The ultraviolet ray intensity on the exposed surface was 9 mW/cm² (at 365 nm). After the exposure, the coating film was developed with a mixed solution of N-methyl-2-pyrrolidone and ethanol (5:1 by volume), and then rinsed with a rinsing liquid (ethanol) to obtain a relief pattern having a sharp end surface. The sensitivity was 18 mJ/cm², and the pattern was not blurred even when heated at 400° C. for 60 minutes.

COMPARATIVE EXAMPLE 3

There are shown below, as Comparative Example, experimental results obtained in the case of a method by which an amine compound containing at least one carbon-carbon double bond and at least one amino group or a quaternary salt thereof which can be dimerized or polymerized by ultraviolet rays is added to a polymer having poly(amic acid) as a major component.

In 20 g of the solution (D) obtained in Example 8 was dissolved 1.57 g (0.01 mole) of 2-(N,N-dimethylamino)ethyl methacrylate, after which the resulting solution was filtered under pressure through a filter of 5 μm meshes.

The thus obtained solution was applied to a silicon wafer by a spin coating method by means of a spinner, and then dried at 70° C. for 30 minutes to obtain a coating film of 3.2 μm in thickness. The coating film was closely covered with a striped photomask and then irradiated with ultraviolet rays from a 500 W high pressure mercury arc lamp. After the exposure, the coating film was developed with a mixed solution of N,N-dimethylacetamide and ethanol (5:1 by volume), and then rinsed with ethanol to obtain a relief pattern. The sensitivity was 3,200 mJ/cm², which was lower than in all of Examples 8 to 13.

EXAMPLE 14

In 1,791 g of N-methyl-2-pyrrolidone was dissolved 100 g (0.5 mole) of 4,4'-diaminodiphenyl ether in a stream of nitrogen to prepare an amine solution. Subsequently, 109 g (0.5 mole) of powdery pyromellitic acid dianhydride was added with stirring while maintaining the temperature of the solution at about 15° C. by ice-cooling. After completion of the addition, the resulting mixture was further allowed to react at about 15° C. for 3 hours to obtain a solution (F) having a viscosity of 60 poises (at 30° C.).

In 100 g of the solution (F) were dissolved 11.7 g (0.05 mole) of 2-(N,N-dimethylamino)ethyl p-azidobenzoate and 2 g (0.01 mole) of ethylene glycol dimethacrylate, after which the resulting solution was filtered under pressure through a filter of 5 μm meshes.

The thus obtained solution was applied to a silicon wafer by a spin coating method using a spinner, and then dried under a vacuum of 2 mmHg for 1 hour to obtain a coating film of 1.5 μm in thickness.

The coating film was even and uniform and adhered to the substrate sufficiently. The coating film was closely covered with a striped mask and then irradiated with ultraviolet rays from a 500 W high pressure mercury arc lamp. The ultraviolet ray intensity on the exposed surface was 15 mW/cm$^2$ in a wavelength region of 365 nm. After the exposure, the coating film was developed with a mixed solution of N-methyl-2-pyrrolidone and ethanol (4:1 by volume), and then rinsed with a rinsing liquid (ethanol) to obtain a relief pattern. The change with the lapse of time in the residual film thickness was measured, and the sensitivity was calculated to be 20 mJ/cm$^2$ when there was taken, as sensitivity, an exposed amount giving a value of 0.5 in terms of the residual film thickness normalized by the applied film thickness. The relief pattern possessing a sharp end surface having a minimum line width of 3 μm at an exposure dose of 100 mJ/cm$^2$ which was 5 times the sensitivity, was not blurred even when heated at 400° C. for 60 minutes.

EXAMPLE 15

Examinations were carried out by using the polymer solution (F) obtained in Example 14 and varying the light-sensitive compound (b) and the compound (d) having unsaturated bonding. The materials examined and the results are shown in Nos. 39 to 62 in Tables 9 to 11. In the tables, the phrase "equivalent based on polymer COOH" in the column for the light-sensitive compound (b) means the number of equivalents of the compound (b) added to the total carboxyl groups of the polymer (a). In the column for the compound (d) having unsaturated bonding, the phrase "the number of moles" means the number of moles added to the light-sensitive compound (d).

The light- or radiation-sensitive polymer composition prepared in the manner described above was applied to a support by a spin coating method using a spinner, and then dried under a vacuum of 2 mm Hg for 1 hour to obtain a coating film, after which the coating film was irradiated with ultraviolet rays through a striped photomask by means of a 500 W high pressure mercury arc lamp, developed, rinsed with ethanol, and then cured at 350° C. for 1 hour. The sensitivity is expressed by the term "good" when it is 100 mJ/cm$^2$ or less at an exposed dose (measured at 365 nm) giving a value of 0.5 in terms of the post-development film thickness nomalized by the applied film thickness, and by the term "bad" when it is more than 100 mJ/cm$^2$. The heat resistance is expressed by the term "good" when the weight loss is 1% or less and the pattern formed is not blurred after curing at 350° C. for 1 hour followed by heating at 300° C. for 1 hour, and by the term "bad" when the weight loss is more than 1%.

In Tables 9 to 11, when the added amount of the light-sensitive compound (b) was 0.4 equivalent or less based on the polymer COOH groups, the sensitivity was bad, and when it was more than 3 equivalents, the heat resistance was bad.

TABLE 9

| No. | Light-sensitive Compound (b) (equivalent based on polymer COOH) | Compound (d) (the number of moles) | Sensitivity | Heat resistance |
|---|---|---|---|---|
| 39 | N$_3$–⟨O⟩–COCH$_2$CH$_2$N(CH$_3$)$_2$ (1.0) | CH$_2$=C(CH$_3$)–CO(CH$_2$CH$_2$O)$_2$C(CH$_3$)=CH$_2$ (0.1) | Good | Good |
| 40 | " (1.0) | CH$_2$=CH–CH$_2$CC(CH$_2$)$_4$COCH$_2$–CH=CH$_2$ (0.1) | " | " |
| 41 | " (0.8) | CH–CO\NCH$_2$CH$_2$OC–CH=CH$_2$ / CH–CO (0.1) | " | " |
| 42 | N$_3$SO$_2$–⟨O⟩–COCH$_2$CH$_2$N(CH$_3$)$_2$ (1.0) | " (0.1) | " | " |
| 43 | " (0.8) | ⟨O⟩(–COOCH$_2$–CH=CH$_2$)$_2$ (0.1) | " | " |
| 44 | " (0.5) | CHCOOCH$_2$–CH=CH$_2$ ‖ CHCOOCH$_2$–CH=CH$_2$ (0.1) | " | " |

TABLE 9-continued

| No. | Light-sensitive Compound (b) (equivalent based on polymer COOH) | | Compound (d) (the number of moles) | Sensitivity | Heat resistance |
|---|---|---|---|---|---|
| 45 | $N_3-C_6H_4-COCH_2CH_2CH_2N(CH_3)_2$ | (1.0) | $(CH_2=CHCOOCH_2)_2C(CH_2OH)_2$ | (0.1) | " | " |
| 46 | " | (1.0) | $CH_2=CH-CO(CH_2CH_2O)_3CCH=CH_2$ (with two C=O) | (0.1) | " | " |

TABLE 10

| No. | Light-sensitive Compound (b) (equivalent based on polymer COOH) | | Compound (d) (the number of moles) | Sensitivity | Heat resistance |
|---|---|---|---|---|---|
| 47 | $N_3-C_6H_4-CCH=CH-C_6H_4-N(CH_3)_2$ (with C=O) | (1.0) | $CH_2=CH-CO(CH_2CH_2O)_3CCH=CH_2$ | (0.1) | Good | Good |
| 48 | $N_3-C_6H_4-CCH=CH-C_6H_4-N(CH_3)_2$ | (0.5) | phthalate-bis(allyl) : $C_6H_4(COOCH_2-CH=CH_2)_2$ | (0.1) | " | " |
| 49 | " | (0.5) | $(CH_2=C(CH_3)COOCH_2)_4C$ | (0.1) | " | " |
| 50 | " | (0.2) | $CH_2=CH-CH_2OC(CH_2)_4COCH_2-CH=CH_2$ (with two C=O) | (0.1) | Bad | 107 " |
| 51 | $N_3-C_6H_4-O-C_6H_4-N(CH_3)_2$ | (0.5) | triazine with $O-CH_2CH=CH_2$, $CH_2=CH-CH_2O$, $OCH_2-CH=CH_2$ substituents | (0.1) | Good | " |
| 52 | " | (5.0) | $C_6H_5-N(CH_2CH_2OCCH=CH_2)_2$ | (0.1) | " | Bad |
| 51 | $N_3-C_6H_4-C(=O)-O-C_6H_4-N(CH_3)_2$ | (1.0) | " | (0.1) | " | Good |

TABLE 11

| No. | Light-sensitive Compound (b) (equivalent based on polymer COOH) | | Compound (d) (the number of moles) | Sensitivity | Heat resistance |
|---|---|---|---|---|---|
| 54 | $N_3-C_6H_4-C(=O)-O-C_6H_4-N(CH_3)_2$ | (1.0) | $(CH_2=CHCOCH_2)_2C(CH_2OH)_2$ | (0.1) | Good | Good |
| 55 | $N_3-C_6H_4-CH=CHC(=O)-C_6H_4-N(CH_3)_2$ | (1.0) | " | (0.1) | " | " |
| 56 | $N_3-C_6H_4-CH=CHC(=O)-C_6H_4-N(CH_3)_2$ | (1.0)(1.0) | $C_6H_4(COCH_2-CH=CH_2)_2$ (with two C=O) | (0.1) | " | " |

TABLE 11-continued

| No. | Light-sensitive Compound (b) (equivalent based on polymer COOH) | | Compound (d) (the number of moles) | | Sensitivity | Heat resistance |
|---|---|---|---|---|---|---|
| 57 | " | (1.0) | $\begin{array}{c}CH-CO\\ \parallel \quad\quad\quad\;\;\;NCH_2CH_2OCCH=CH_2\\ CH-CO\end{array}$ (with C=O on N side) | (0.1) | " | " |
| 58 | $N_3-\bigcirc-\overset{OH}{\underset{\parallel}{C}}NCH_2CH_2N\overset{CH_3}{\underset{CH_3}{}}$ | (1.0) | " | (0.1) | " | " |
| 59 | " | (1.0) | $CH_2=C(CH_3)-\overset{O}{\underset{\parallel}{C}}O(CH_2CH_2O)_2\overset{O}{\underset{\parallel}{C}}C(CH_3)=CH_2$ | (0.1) | " | " |
| 60 | $N_3-\bigcirc-\overset{O}{\underset{\parallel}{C}}OCH_2NH_2$ | (1.0) | " | (0.1) | " | " |
| 61 | " | (1.0) | $\begin{array}{c}CH_2=CHCOCH_2\quad\quad CH_2OCCH=CH_2\\ \parallel\quad\quad\quad\quad\quad\quad\quad\parallel\\ O\quad\quad\quad\quad\quad\quad\quad O\\ CH_2=CHCOCH_2\quad\quad CH_2OCCH=CH_2\\ \parallel\quad\quad\quad\quad\quad\quad\quad\parallel\\ O\quad\quad\quad\quad\quad\quad\quad O\end{array}$ (with central cyclopentanone) | (0.1) | " | " |
| 62 | " | (0.1) | benzene with COOCH₂—CH=CH₂ and COOCH₂—CH=CH₂ | (0.1) | " | " |

There are shown below, as Comparative Example, experimental results obtained in the case of a method(-method(a)) by which an amine compound containing at least one carbon-carbon double bond and at least one amino group or quaternary salt thereof which can be dimerized or polymerized by ultraviolet rays is added to a polymer having poly(amic acid) as a major component (i.e., the same poly(amic acid) as used in Example 1.).

COMPARATIVE EXAMPLE 4

In 100 g of the polymer solution (F) obtained in Example 14 was dissolved 7.85 g (0.05 mole) of 2-(N,N-dimethylamino)ethyl methacrylate, and the resulting solution was filtered under pressure through a filter of 5 μmeshes. The thus obtained solution was applied to a silicon wafer by a spin coating method using a spinner, and then dried at 70° C. for 30 minutes to obtain a coating film of 1.8 μm in thickness. The coating film was closely covered with a striped photomask made of soda glass and then irradiated with ultraviolet rays from a 500 W high pressure mercury arc lamp. After the exposure, the coating film was developed with a mixed solution of N-methyl-2-pyrrolidone and ethanol (5:1 by volume) and then rinsed with ethanol to obtain a relief pattern. The sensitivity was 2,500 mJ/cm², which was lower than in the case of all of Nos. 39 to 62 in Tables 9 to 11.

EXAMPLE 16

Synthesis of N,N-diethylamino-N'-(p-azidobenzylideneacetyl)ethylenediamine.

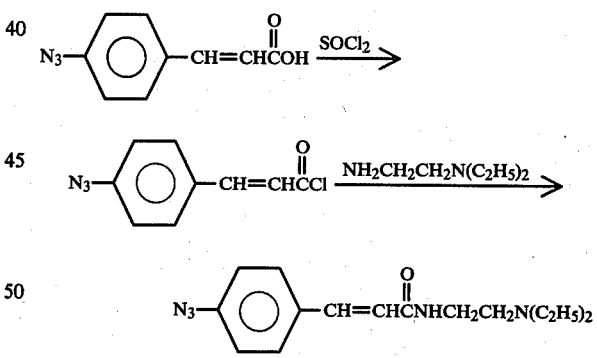

To 17 g (90 millimoles) of p-azidocinnamic acid was added 53 g (450 millimoles) of thionyl chloride, and the resulting solution was refluxed with heating. When the generation of SO₂ gas terminated, the reflux was stopped, after which the excess thionyl chloride was distilled off under reduced pressure to obtain 14.8 g of p-azidocinnamic acid chloride as the distillation residue.

Subsequently, 8.5 g (40 millimoles) of the p-azidocinnamic acid chloride was dissolved in chloroform, and 4.8 g (40 millimoles) of N,N-diethylaminoethylenediamine was added thereto at a reaction temperature of 10° to 20° C., after which the resulting solution was further allowed to react for 1 hour. The chloroform was distilled off under reduced pressure, and 100 ml of water was added to the resulting oily substance, after which a solution of 1.7 g of sodium hydroxide in 20 ml of water was added thereto on an ice bath. The organic layer separated was extracted with chloroform, and the extract was further washed with water and then dried over anhydrous sodium sulfate. The solvent was distilled off to obtain 11 g of an oily substance as the distillation residue. This oily substance decomposed at 130° C. with formation of bubbles and generation of heat. This oily substance was identified as the compound of this invention by analysis using the following spectral means:

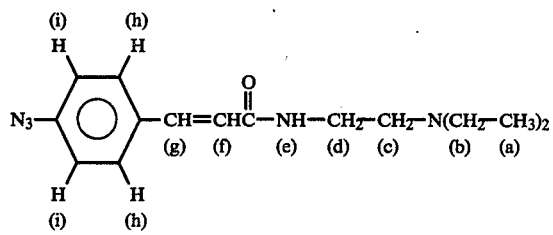

Nuclear Magnetic Resonance (NMR): Chemical shifts measured in deuterated chloroform are given below in ppm unit, and in the parentheses are shown a pattern, a coupling constant, an integration ratio and assignment in this order.

1.1 (triplet, 6 Hz, 6H, a), 2.7 (qualtet and triplet, 6 Hz, 6H, b and c), 3.5 (qualtet, 6 Hz, 4H, d), 6.45 (doublet, 16 Hz, 1H, f), 7.0 (doublet and singlet, 10 Hz, 3H, e and h), 7.5 (doublet, 10 Hz, 2H, i), 7.65 (doublet, 16 Hz, 2H, g).

Infrared Absorption Spectrum (IR): The main absorption maxima measured by a liquid film method are given below in cm$^{-1}$ unit, and in the parentheses are shown their assignment. 2,130 (azide group), 1,650 (double bond), 1,620 (carbonyl group).

The aforesaid compound of this invention has an ultraviolet absorption maximum region at 305 nm, and its absorption edge reaches a long wavelength of 380 nm, so that the compound is sensitive to the objective ultraviolet rays in a long wavelength region.

EXAMPLE 17

Synthesis of 2-(N,N-diethylamino)ethyl p-azidocinnamate.

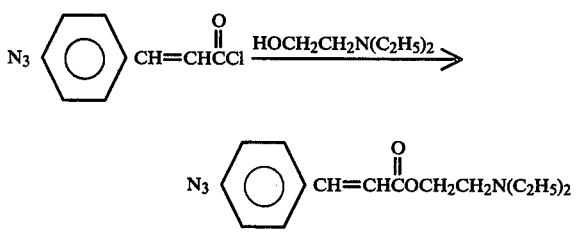

In 80 g of chloroform was dissolved 6.2 g (30 millimoles) of the p-azidocinnamic acid chloride obtained in Example 16, and 3.5 g (30 millimoles) of 2-diethylaminoethanol was added dropwise while maintaining the solution temperature at 10° to 20° C., after which the resulting mixture was allowed to react for 1 hour. The chloroform was distilled off under reduced pressure, and 100 ml of water was added to the resulting oily substance, after which a solution of 1.3 g of sodium hydroxyde in 20 ml of water was added thereto on an ice bath. The organic layer separated was extracted with chloroform, and the extract was further washed with water and then dried over anhydrous sodium sulfate. The solvent was distilled off to obtain 7.2 g of an oily substance as the distillation residue. This oily substance decomposed at 130° C. with formation of bubbles and generation of heat. This oily substance was identified as the compound of this invention by analysis using the following spectral means.

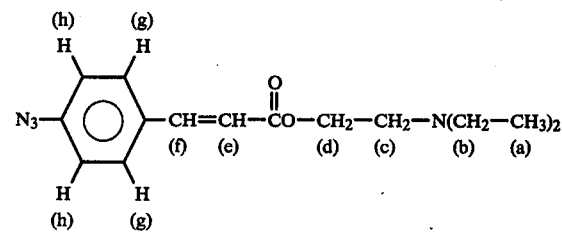

Nuclear Magnetic Resonance (NMR): Chemical shifts measured in deuterated chloroform are given below in ppm unit, and in the parentheses are shown a pattern, a coupling constant, an integration ratio and assignment in this order.

1.1 (triplet, 6 Hz, 6H, a), 2.75 (qualtet and triplet, 6 Hz, 6H, b and c), 4.35 (triplet, 6 Hz, 2H, d), 6.45 (doublet 16 Hz, 1H, e), 7.08 (doublet, 8 Hz, 2H, g), 7.52 (doublet, 8 Hz, 2H, h), 7.63 (doublet, 16 Hz, 1H, f).

Infrared Absorption Spectrum (IR): The main absorption maxima measured by a liquid film method are given below in cm$^{-1}$ unit, and in the parentheses are shown their assignment.

2,120 (azido group), 1,710 (carbonyl group), 1,640 (olefin group).

The aforesaid compound of this invention has an ultraviolet absorption maximum region at 314 nm, and its absorption edge reaches a long wavelength of 370 nm, so that the compound is sensitive to the objective ultraviolet rays in a long wavelength region.

EXAMPLE 18

Synthesis of 2-(N,N-dimethylamino)ethyl p-azidocinnamate

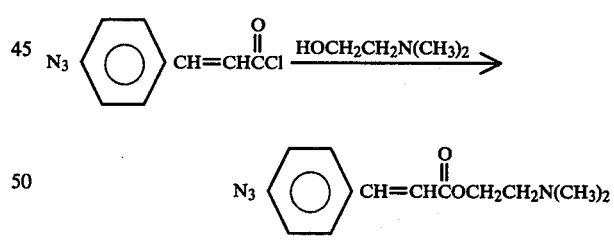

In carbon tetrachloride was dissolved 14 g (70 millimoles) of the p-azidocinnamic acid chloride obtained in Example 16, and 6 g (70 millimoles) of 2-dimethylaminoethanol was added dropwise to the resulting solution at 10° to 20° C., after which the resulting mixture was allowed to react for 1 hour. The deposited precipitate was collected by filtration, and 100 ml of water was added thereto.

To the thus obtained solution was added, on an ice bath, a solution of 2.8 g of sodium hydroxide in 50 ml of water, and the organic layer separated was extracted with chloroform, after which the extract was further washed with water and then dried over anhydrous sodium sulfate. The solvent was distilled off to obtain 9.5 g of an oily substance as the distillation residue. The oily substance decomposed at 125° C. with formation of bubbles and generation of heat. The oily substance was identified as the compound of this invention by analysis using the following spectral means:

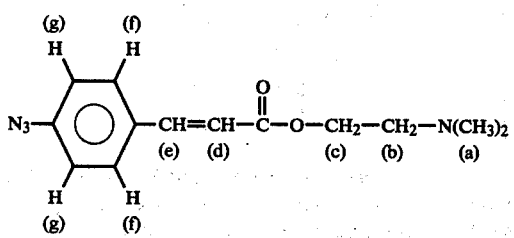

Nuclear Magnetic Resonance (NMR): Chemical shifts measured in deuterated chloroform are given below in ppm unit, and in the parentheses are shown a pattern, a coupling constant, an integration ratio and assignment in this order.

2.4 (singlet, 6H, a), 2.7 (triplet, 8 Hz, 2H, b), 4.4 (triplet, 8 Hz, 2H, c), 6.45 (doublet, 16 Hz, 1H, d), 7.05 (doublet, 8 Hz, 2H, f), 7.57 (doublet, 8 Hz, 2H, e), 7.72 (doublet, 16 Hz, 1H, e).

Infrared Absorption Spectrum (IR): The main absorption maxima measured by a liquid film are given below in cm$^{-1}$ unit, and in the parentheses are shown their assignment.

2,140 (azide group), 1,720 (carbonyl group), 1,630 (double bond).

The aforesaid compound of this invention has an ultraviolet absorption maximum region at 315 nm, and its absorption edge reaches a long wavelength of 370 nm, so that the compound is sensitive to the objective ultraviolet rays in a long wavelength region.

What is claimed is:

1. A light- or radiation-sensitive polymer composition comprising
   (a) a poly(amic acid) having as a major component a repeating unit of the formula:

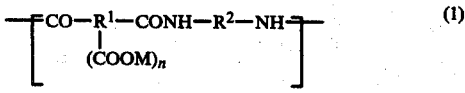

wherein $R^1$ is a trivalent or tetravalent organic group having at least 2 carbon atoms; $R^2$ is a divalent organic group having at least 2 carbon atoms; M is hydrogen or an ammonium ion; and n is an integer of 1 or 2, and (b) one or more light- or radiation-sensitive compounds having an amino group and an aromatic azide group or aromatic sulfonylazide group in one molecule selected from the group consisting of a compound of the formula:

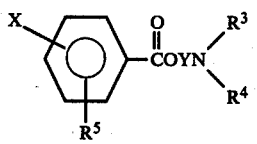

wherein X is —$N_3$ or —$SO_2N_3$; Y is an alkylene group; and $R^3$, $R^4$ and $R^5$ are independently hydrogen or a lower alkyl group; a compound of the formula:

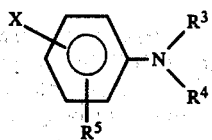

wherein X is —$N_3$ or —$SO_2N_3$; and $R^3$, $R^4$ and $R^5$ are independently hydrogen or a lower alkyl group; a compound of the formula:

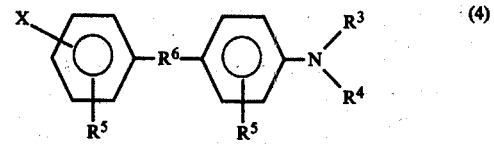

wherein X is —$N_3$ or —$SO_2N_3$; $R^3$, $R^4$ and $R^5$ are independently hydrogen or a lower alkyl group; a compound of the formula:

wherein X is —$N_3$ or —$SO_2N_3$; and $R^7$ is hydrogen or a lower alkyl group; a compound of the formula:

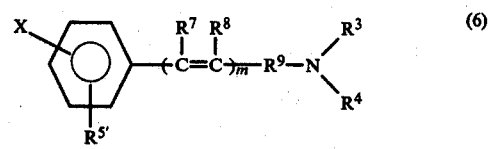

wherein X is —$N_3$ or —$SO_2N_3$; $R^3$ and $R^4$ are independently hydrogen or a lower alkyl group; $R^{5'}$ is hydrogen, halogen, a nitro group, a lower alkoxy group, a lower alkyl group or a cyano group; $R^7$ is hydrogen or a lower alkyl group; $R^8$ is hydrogen, halogen, a cyano group or a lower alkyl group; $R^9$ is a divalent organic group bonding to the N atom and the moiety having an unsaturated bonding; and m is an integer of 1 to 3; and a compound of the formula:

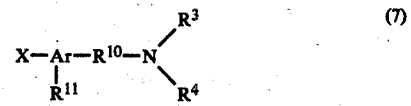

wherein X is —$N_3$ or —$SO_2N_3$; Ar is an aromatic group selected from a benzene ring which may be fused one and a heterocyclic ring; $R^3$ and $R^4$ are independently hydrogen or a lower alkyl group; $R^{10}$ is a divalent organic group bonding to the Ar and the N atom; and $R^{11}$ is hydrogen, halogen, a lower alkyl group, a lower alkoxy group, a nitro group, a carboxyl group, or a sulfonic acid group; in an amount of 0.05 to 5 times the equivalent of the total COOM groups of the repeating units of the formula (1) of component (a).

2. A composition according to claim 1, which further comprises
 (c) one or more photosensitizers in an amount of from 0.01% by weight to 10% by weight based on the total weight of the components (a), (b) and (c), and/or amine compounds having at least one unsaturated bonding in an amount of 0.05 mole to 2 moles per mole of the component (b) and the total amounts of the component (b) and the amine of the component (c) being no more than 3 times the equivalent of the COOM groups of the component (a).

3. A composition according to claim 1, which further comprises
 (d) one or more compounds having at least two unsaturated bondings in one molecule except for the amine compound (c).

4. A composition according to claim 1, which further comprises
 (c) one or more photosensitizers and/or amine compounds having at least one unsaturated bonding, and
 (d) one or more compounds having at least two unsaturated bondings in one molecule except for the above-mentioned amine compounds (c).

5. A composition according to claim 1, 2, 3 or 4, wherein the repeating unit of the formula (1) is

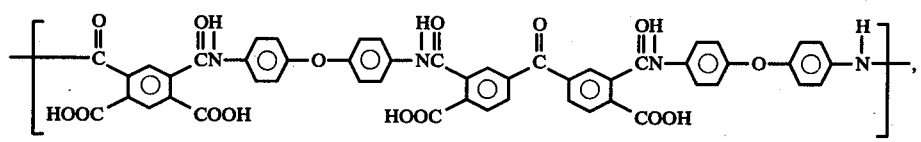

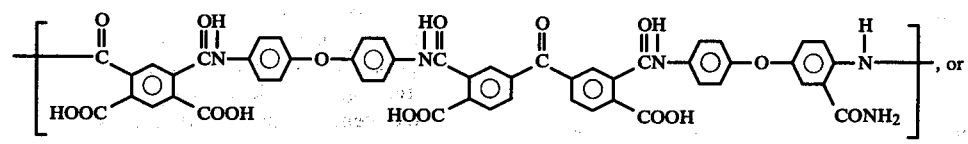

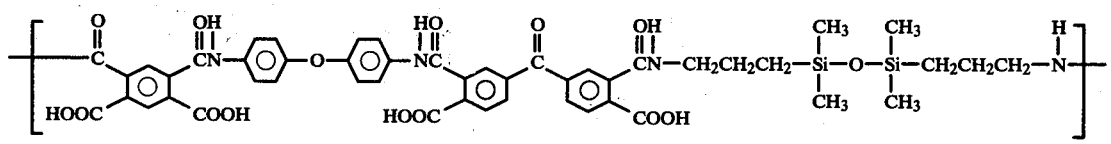

6. A composition according to claim 1, 2, 3 or 4, wherein the component (b) is a compound of the formula:

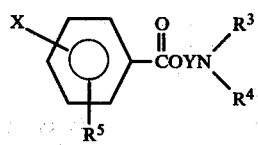

wherein X is —N$_3$ or —SO$_2$N$_3$; Y is an alkylene group; and R$^3$, R$^4$ and R$^5$ are independently hydrogen or a lower alkyl group.

7. A composition according to claim 1, 2, 3 or 4, wherein the component (b) is a compound of the formula:

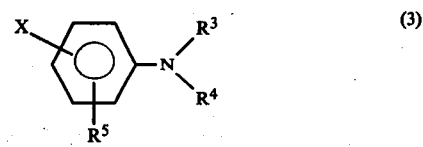

wherein X is —N$_3$ or —SO$_2$N$_3$; and R$^3$, R$^4$ and R$^5$ are independently hydrogen or a lower alkyl group.

8. A composition according to claim 1, 2, 3 or 4, wherein the component (b) is a compound of the formula:

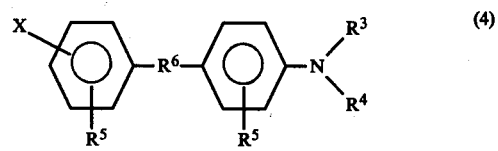

wherein X is —N$_3$ or —SO$_2$N$_3$; R$^3$, R$^4$ and R$^5$ are independently hydrogen or a lower alkyl group; and

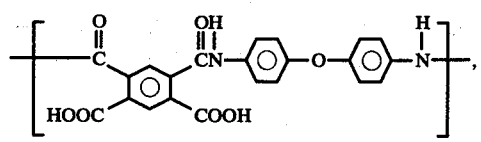

9. A composition according to claim 1, 2, 3 or 4, wherein the component (b) is a compound of the formula:

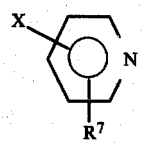 (5)

wherein X is —N₃ or —SO₂N₃; and R⁷ is hydrogen or a lower alkyl group.

10. A composition according to claim 1, 2, 3 or 4, wherein the component (b) is a compound of the formula:

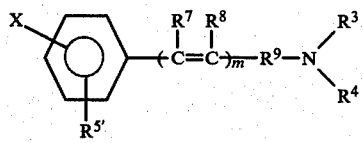 (6)

wherein X is —N₃ or —SO₂N₃; R³ and R⁴ are independently hydrogen or a lower alkyl group; R⁵' is hydrogen, halogen, a nitro group, a lower alkoxy group, a lower alkyl group or a cyano group; R⁷ is hydrogen or a lower alkyl group; R⁸ is hydrogen, halogen, a cyano group or a lower alkyl group; R⁹ is a divalent organic group bonding to the N atom and the moiety having an unsaturated bonding; and m is an integer of 1 to 3.

11. A composition according to claim 1, 2, 3 or 4, wherein the component (b) is a compound of the formula:

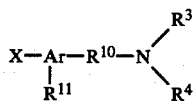 (7)

wherein X is —N₃ or —SO₂N₃; Ar is an aromatic group selected from a benzene ring which may be fused one and a heterocyclic ring; R³ and R⁴ are independently hydrogen or a lower alkyl group; R¹⁰ is a divalent organic group bonding to the Ar and the N atom; and R¹¹ is hydrogen, halogen, a lower alkyl group, a lower alkoxy group, a nitro group, a carboxyl group, or a sulfonic acid group.

12. A composition according to claim 6, wherein the compound of the formula (2) is

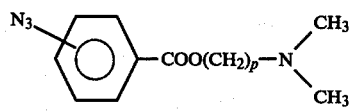

wherein p is 2 or 3.

13. A composition according to claim 10, wherein the compound of the formula (6) is

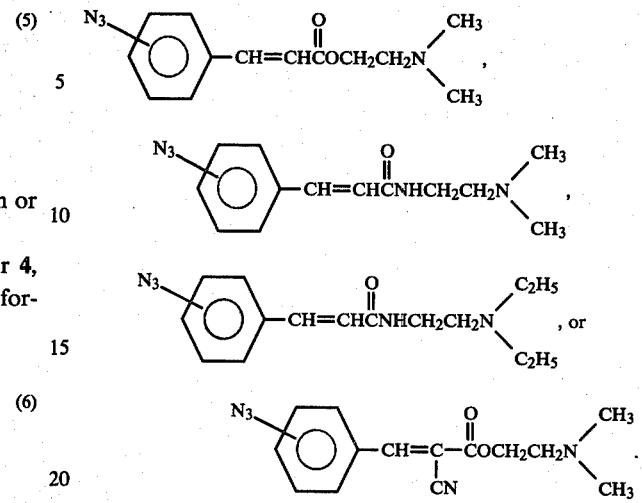

14. A composition according to claim 10, wherein the compound of the formula (6) is

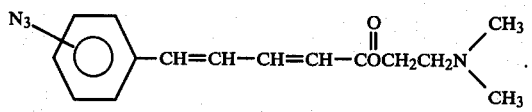

15. A composition according to claim 2 or 4, wherein the photosensitizer of the component (C) is N,N'-tetramethyl-4,4'-diaminobenzophenone or N,N'-tetraethyl-4,4'-diaminobenzophenone.

16. A composition according to claim 3 or 4, wherein the unsaturated bonding in the component (d) is an acryloyl or methacryloyl group.

17. A composition according to claim 1, wherein the component (b) is 2-(N,N-dimethylamino)ethyl[p-azidobensoate]p-azidobenzoate.

18. A composition according to claim 1, wherein the one or more light- or radiation-sensitive compounds (b) is incorporated within the composition in an amount of 0.04 to 2 times the equivalent of the total COOM groups of the repeating units of the formula (1) of component (a).

19. A composition according to claim 1, which further comprises a solvent in which component (a) and component (b) are dissolved, said solvent comprising an aprotic polar solvent and being present in an amount of 100 parts to 10,000 parts by weight per 100 parts by weight of the total of the component (a) and the component (b).

20. A composition according to claim 1, which further comprises an aprotic polar solvent in which component (a) and component (b) are dissolved, the solvent being present in an amount of 100 parts to 10,000 parts by weight based on 100 parts by weight on the total of component (a) and component (b).

21. A composition according to claim 1, wherein component (b) is a compound capable of being incorporated into the repeating unit of the Formula (I) of component (a) by ionic combination of the amino group of the component (b) with the carboxyl group in the repeating unit of formula (1).

* * * * *